(12) United States Patent
Sun et al.

(10) Patent No.: US 8,791,488 B2
(45) Date of Patent: Jul. 29, 2014

(54) SURFACE-TREATED FLUORESCENT MATERIAL AND PROCESS FOR PRODUCING SURFACE-TREATED FLUORESCENT MATERIAL

(75) Inventors: Ren-de Sun, Osaka (JP); Yasuhiro Nakatani, Osaka (JP); Takahiro Oomura, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 13/813,532

(22) PCT Filed: Aug. 4, 2011

(86) PCT No.: PCT/JP2011/067834
§ 371 (c)(1),
(2), (4) Date: Mar. 11, 2013

(87) PCT Pub. No.: WO2012/018066
PCT Pub. Date: Feb. 9, 2012

(65) Prior Publication Data
US 2013/0161678 A1 Jun. 27, 2013

(30) Foreign Application Priority Data
Aug. 4, 2010 (JP) .................................. 2010-175606

(51) Int. Cl.
- *H01L 33/00* (2010.01)
- *H01L 33/50* (2010.01)
- *H05B 33/14* (2006.01)
- *C09K 11/77* (2006.01)

(52) U.S. Cl.
CPC .......... *C09K 11/7734* (2013.01); *H01L 33/502* (2013.01); *H05B 33/14* (2013.01)
USPC .............. 257/98; 257/E33.061; 252/301.4 R; 252/301.4 F; 428/403; 428/404

(58) Field of Classification Search
USPC ....... 257/98, E33.031; 252/301.4 R–301.4 H; 428/403, 404
See application file for complete search history.

(56) References Cited

U.S. PATENT DOCUMENTS 5,856,009 A * 1/1999 Nishio et al. .................. 428/404
6,242,043 B1 * 6/2001 Lipp .............................. 427/64

(Continued)

FOREIGN PATENT DOCUMENTS

CN 102822313 12/2012
DE 10 2008 060 680 6/2010

(Continued)

OTHER PUBLICATIONS

International Search Report issued Nov. 8, 2011 in International (PCT) Application No. PCT/JP2011/067834.

(Continued)

*Primary Examiner* — Matthew Reames
*Assistant Examiner* — Farid Khan
(74) *Attorney, Agent, or Firm* — Wenderoth, Lind & Ponack, L.L.P.

(57) ABSTRACT

Provided are a surface treated phosphor having high dispersibility and remarkably improved moisture resistance without degradation in fluorescence properties, and a method of producing the surface treated phosphor.

The present invention relates to a surface treated phosphor including: a phosphor matrix including an alkaline earth metal and silicon; and a surface treatment layer including an alkaline earth metal, silicon, and a specific element belonging to groups 4 to 6 of the periodic table, wherein, when element distribution of the surface treatment layer in the thickness direction viewed in cross-section is determined by electron microscopy and energy dispersive X-ray spectroscopy coupled with the electron microscopy, the position representing the maximum peak of a specific element content is located closer to the surface than the position representing the maximum peak of a silicon content and silicon contents of the phosphor matrix and the surface treatment layer satisfy the following formula (1):

[Formula 1]

$$S_1 < S_2 \quad (1)$$

wherein $S_1$ represents the silicon content of the phosphor matrix and $S_2$ represents the silicon content of the surface treatment layer.

22 Claims, 13 Drawing Sheets

(56) References Cited

U.S. PATENT DOCUMENTS

| | | | |
|---|---|---|---|
| 2005/0040765 A1 | 2/2005 | Okumura et al. | |
| 2006/0001352 A1* | 1/2006 | Maruta et al. | 313/486 |
| 2006/0145123 A1 | 7/2006 | Li et al. | |
| 2007/0125984 A1* | 6/2007 | Tian et al. | 252/301.4 S |
| 2007/0172580 A1* | 7/2007 | Fan et al. | 427/66 |
| 2007/0194686 A1 | 8/2007 | Kwon et al. | |
| 2009/0289271 A1 | 11/2009 | Tian et al. | |
| 2011/0001091 A1* | 1/2011 | Kim et al. | 252/301.4 S |
| 2011/0304264 A1* | 12/2011 | Winkler | 313/504 |
| 2013/0094186 A1 | 4/2013 | Sun et al. | |

FOREIGN PATENT DOCUMENTS

| | | |
|---|---|---|
| JP | 1-110590 | 4/1989 |
| JP | 9-104863 | 4/1997 |
| JP | 11-256150 | 9/1999 |
| JP | 2001-139941 | 5/2001 |
| JP | 2002-539925 | 11/2002 |
| JP | 2005-100954 | 4/2005 |
| JP | 2006-124680 | 5/2006 |
| JP | 2006-232949 | 9/2006 |
| JP | 2007-224262 | 9/2007 |
| JP | 2008-111080 | 5/2008 |
| JP | 2009-515030 | 4/2009 |
| JP | 2009-132902 | 6/2009 |
| JP | 2009-524736 | 7/2009 |
| JP | 2009-526089 | 7/2009 |
| WO | 2007/087480 | 8/2007 |

OTHER PUBLICATIONS

Supplementary European Search Report issued Feb. 5, 2014 in counterpart European Application No. 11814691.9.

* cited by examiner

SURFACE-TREATED FLUORESCENT MATERIAL AND PROCESS FOR PRODUCING SURFACE-TREATED FLUORESCENT MATERIAL

This application is a U.S. national stage of International Application No. PCT/JP2011/067834 filed Aug. 4, 2011.

TECHNICAL FIELD

The present invention relates to a surface treated phosphor with remarkably improved moisture resistance and a method of producing the surface treated phosphor.

BACKGROUND ART

Recently, semiconductor light-emitting devices emitting white light (white LEDs) have attracted attention as next-generation light sources due to their advantages such as low power consumption, high efficiency, eco-friendliness, and long life.

In order to produce white light with white LEDs, a blue or ultraviolet LED is commonly combined with phosphors (red, yellow, green phosphors, and the like) which can be excited by light of such LEDs.

Silicate (also referred to as silicate salt) phosphors having an alkaline earth metal element easily provide a wider range of emission wavelength which is obtained by composition control and have high luminous efficiency and the like. Therefore, such silicate phosphors attracted attention due to their characteristics. Particularly, typical examples of silicate phosphors include those having a structure such as $(Sr,Ba,Ca)_2SiO_4:Eu^{2+}$ disclosed in Patent Literature 1 and $(Sr,Ba,Ca)_3SiO_5:Eu^{2+}$ disclosed in Patent Literature 2. In such silicate phosphors, control of the relative amount of Sr and Ba, or Sr and Ca allows tuning of an emission wavelength.

However, surfaces of such silicate phosphors having an alkaline earth metal element are easily decomposed and deteriorated by moisture or water in the air. For this reason, long-term use of the silicate phosphors in the air tends to cause a reduction in emission intensity or a change in color tone, leading to a degradation of properties as phosphors and poor durability.

In order to improve moisture resistance of phosphors, covering of the surfaces of phosphor particles with oxides and the like by a vapor phase method (dry method) or a liquid phase method (wet method) is examined.

An example of the vapor phase method includes coating of the surfaces of sulfide phosphor particles with an aluminum oxide film by chemical vapor deposition (CVD) (Patent Literature 3) or a plasma method (Patent Literature 4).

Examples of the liquid phase method include a sol-gel reaction and a neutralization sedimentation method. For example, Patent Literature 5 discloses a surface treatment method of phosphor particles in which alkoxides of Si, Ti or the like and/or derivatives thereof are subjected to hydrolysis and dehydration polymerization in the presence of a large amount of aqueous ammonia at a reaction temperature of 0 to 20° C. Further, Patent Literature 6 discloses a phosphor in which a particulate or layered Si-containing compound is deposited on its surface.

Further, Patent Literature 7 discloses a method of applying a zirconia film by a sol-gel method. Patent Literature 8 discloses a method of depositing a metal hydroxide on the surface of phosphor particles by neutralization of an alkaline solution, in which phosphors are dispersed, with an acidic solution containing an ion such as aluminum.

However, it is difficult to completely disperse powdered phosphor particles by the vapor phase method disclosed in Patent Literatures 3 and 4. Therefore, it is difficult in practice to cover the entire surface of each phosphor particles evenly, and pinholes, unevenness of the covering, and the like are likely to be generated. Further, a vapor phase method is problematic because it is usually performed at high temperature of 400° C. or higher, resulting in a remarkable degradation of fluorescence properties after treatment depending on the type of phosphors. In addition, large-scale apparatus is needed for the method, leading to increased production costs.

In the case of using a sol-gel method, which is a liquid phase method (Patent Literatures 5, 6, and 7), the kinds of covering materials can be freely selected. However, since a metal alkoxide, which is a starting material, usually has high reactivity, it is very difficult to control reaction conditions for allowing a hydrolysis reaction to be carried out only on the surfaces of phosphor particles. Further, a film made by a sol-gel method is less likely to be dense because it includes an organic component such as an alkoxyl group left due to imperfect hydrolysis and alcohols eliminated during a hydrolysis reaction.

Further, the covering method disclosed in Patent Literature 5 is problematic in view of reaction efficiency and costs because a hydrolysis reaction is carried out in the presence of a large amount of aqueous ammonia, so that almost all raw materials undergo a reaction to be consumed in a solution, not on the surfaces of phosphor particles. In addition, phosphors may be hydrolyzed to deteriorate during treatment because of the large amount of aqueous ammonia.

In the method disclosed in Patent Literature 6, a particulate or layered Si-containing compound, which is a covering material, is deposited on the surfaces of phosphor particles. However, improvement in moisture resistance is hardly observed in practice. Further, reaction conditions disclosed in Examples of Patent Literature 6 are problematic because a covering reaction hardly occurs on the surfaces of phosphor particles. Even if part of the surface is covered, it is difficult for particulate covering to efficiently block moisture.

The method disclosed in Patent Literature 7 is problematic in view of efficiency and costs because a long-term reaction and precise control of temperature and processes are needed.

In the neutralization sedimentation method disclosed in Patent Literature 8, it is difficult in practice to deposit a covering material on the surfaces of phosphor particles as a continuous film.

CITATION LIST

Patent Literature

Patent Literature 1: Japanese Kohyo Publication 2009-515030 (JP-T 2009-515030)
Patent Literature 2: Japanese Kokai Publication 1997-104863 (JP-A 1997-104863)
Patent Literature 3: Japanese Kokai Publication 2001-139941 (JP-A 2001-139941)
Patent Literature 4: Japanese Kohyo Publication 2009-524736 (JP-T 2009-524736)
Patent Literature 5: Japanese Kokai Publication 2008-111080 (JP-A 2008-111080)
Patent Literature 6: Japanese Kokai Publication 2007-224262 (JP-A 2007-224262)
Patent Literature 7: Japanese Kokai Publication 2009-132902 (JP-A 2009-132902)

Patent Literature 8: Japanese Kokai Publication H11-256150 (JP-A H11-256150)

SUMMARY OF INVENTION

Technical Problem

The present invention aims to provide a surface treated phosphor having high dispersibility and remarkably improved moisture resistance without degradation of fluorescence properties, and a method of producing the surface treated phosphor.

Solution to Problem

The present invention is a surface treated phosphor comprising: a phosphor matrix including an alkaline earth metal and silicon; and a surface treatment layer including an alkaline earth metal, silicon, and a specific element belonging to groups 4 to 6 of the periodic table, wherein, when element distribution of the surface treatment layer in the thickness direction viewed in cross-section is determined by electron microscopy and energy dispersive X-ray spectroscopy coupled with the electron microscopy, the position representing the maximum peak of a specific element content is located closer to the surface than the position representing the maximum peak of a silicon content and silicon contents of the phosphor matrix and the surface treatment layer satisfy the following formula (1):

[Formula 1]

$$S_1 < S_2 \qquad (1)$$

wherein $S_1$ represents the silicon content of the phosphor matrix and $S_2$ represents the silicon content of the surface treatment layer.

The present invention is described in more detail below.

As a result of intensive investigations by the present inventors in an attempt to solve the above problems, it has been found that when a surface treatment layer including an alkaline earth metal, silicon, and a specific element is formed on the surface of a phosphor matrix and a peak position determined by energy dispersive X-ray spectroscopy and silicon contents of the phosphor matrix and the surface treatment layer satisfy given requirements, a surface treated phosphor having high dispersibility and remarkably improved moisture resistance without degradation in fluorescence properties is obtained. Thus, the present invention has been completed.

A phosphor matrix used for the surface treated phosphor of the present invention is not particularly limited as long as it contains an alkaline earth metal and silicon. The alkaline earth metal refers to elements belonging to group 2 of the periodic table, i.e., beryllium, magnesium, calcium, strontium, barium, and radium. Examples of the phosphor matrix including an alkaline earth metal and silicon include aluminates, nitrides, oxynitrides, and silicates.

Particularly, the phosphor matrix is preferably a silicate phosphor of an alkaline earth metal including silicates that contain an alkaline earth metal element.

An example of the silicates containing an alkaline earth metal element includes a phosphor having a structure that is substantially the same as a crystal structure of $M_2SiO_4$ or $M_3SiO_5$ as a matrix crystal structure, wherein M represents at least one element selected from the group consisting of Mg, Ca, Sr, and Ba; and at least one element selected from the group consisting of Fe, Mn, Cr, Bi, Ce, Pr, Nd, Sm, Eu, Tb, Dy, Ho, Er, Tm, and Yb as an activator.

The phosphor matrix containing an alkaline earth metal element may appropriately include a metal element (for example, Zn, Ga, Al, Y, Gd, or Tb) other than an alkaline earth metal.

The phosphor matrix containing an alkaline earth metal element may appropriately include a small amount of a halogen element (for example, F, Cl, or Br), sulfur (S), or phosphorus (P).

Examples of the phosphor matrix having a $M_2SiO_4$ structure include a green phosphor or a yellow phosphor having a composition represented by the formula (4) or (5):

$(Sr_{1-x}M_x)_ySiO_4:Eu^{2+}$ (4)

wherein M is at least one metal selected from the group consisting of Ba, Ca, Mg, and Zn, x satisfies $0 \leq x \leq 1.0$ and y satisfies $1.5 \leq y \leq 2.5$,

$(Sr_{1-x}M_x)_ySiO_4:Eu^{2+}D$ (5)

wherein M is at least one metal selected from the group consisting of Ba, Ca, Mg, and Zn, D is an anion of a halogen selected from the group consisting of F, Cl, and Br, x satisfies $0 \leq x \leq 1.0$ and y satisfies $1.5 \leq y \leq 2.5$.

An example of the phosphor matrix having a $M_3SiO_5$ structure includes an orange phosphor having a composition represented by the formula (6) or (7):

$(Sr_{1-x}M_x)_ySiO_5:Eu^{2+}$ (6)

wherein M is at least one metal selected from the group consisting of Ba, Ca, Mg, and Zn, and x satisfies $0 \leq x \leq 1.0$ and y satisfies $2.6 \leq y \leq 3.3$,

$(Sr_{1-x}M_x)_ySiO_5:Eu^{2+}D$ (7)

wherein M is at least one metal selected from the group consisting of Ba, Ca, Mg, and Zn, D is an anion of a halogen selected from the group consisting of F, Cl, and Br, x satisfies $0 \leq x \leq 1.0$ and y satisfies $2.6 \leq y \leq 3.3$.

The phosphor matrix may have a two-phase structure of a composite of the $M_2SiO_4$ structure and $M_3SiO_5$ structure (for example, $a(M1)_2SiO_4 \cdot (1-a)(M2)_3SiO_5:Eu^{2+}$).

Specific examples of the phosphor matrix include an orange phosphor having a composition of $Sr_3SiO_5:Eu^{2+}$, $(Sr_{0.9}Mg_{0.025}Ba_{0.075})_3SiO_5:Eu^{2+}$, $(Sr_{0.9}Mg_{0.05}Ba_{0.05})_{2.7}SiO_5:Eu^{2+}$, $(Sr_{0.9}Mg_{0.025}Ba_{0.075})_3SiO_5:Eu^{2+}$, $(Sr_{0.9}Ba_{0.1})_3SiO_5:Eu^{2+}$, $Sr_{0.97}SiO_5:Eu^{2+}F$, $(Sr_{0.9}Mg_{0.1})_{2.9}SiO_5:Eu^{2+}F$, or $(Sr_{0.9}Ca_{0.1})_{3.0}SiO_5:Eu^{2+}F$; a green phosphor having a composition of $(Sr_{0.4}Ba_{0.6})_2SiO_4:Eu^{2+}$, $(Sr_{0.3}Ba_{0.7})_2SiO_4:Eu^{2+}$, $(Sr_{0.2}Ba_{0.8})_2SiO_4:Eu^{2+}$, $(Sr_{0.57}Ba_{0.4}Mg_{0.03})_2SiO_4:Eu^{2+}F$, $(Sr_{0.6}Ba_{0.4})_2SiO_4:Eu^{2+}Cl$, or $(Ba,Sr,Ca)_2(Mg,Zn)Si_2O_7:Eu^{2+}$; a yellow phosphor having a composition of $(Sr_{0.7}Ba_{0.3})_2SiO_4:Eu^{2+F}$, $(Sr_{0.9}Ba_{0.1})_2SiO_4:Eu^{2+}$, or $0.72 [(Sr_{1.025}Ba_{0.925}Mg_{0.05})Si_{1.03}O_4Eu_{0.05}F_{0.12}] \cdot 0.28 [Sr_3Si_{1.02}O_5Eu_{0.6}F_{0.13}]$; and a blue phosphor having a composition of $Ba_2MgSi_2O_7:Eu^{2+}$ and $Ba_2ZnSi_2O_7:Eu^{2+}$.

The phosphors are preferably green or yellow ones having the crystal structure of $M_2SiO_4$.

The particle size of the phosphor matrix is not particularly limited. The median particle size ($D_{50}$) is usually preferably in a range from 0.1 to 100 μm, more preferably in a range from 1.0 to 50 μm, and still more preferably 2.0 to 30 μm. Too small a $D_{50}$ causes not only a reduction in luminance but also easy coagulation of a phosphor matrix, resulting in difficulty in even covering treatment. Too large a $D_{50}$ causes poor dispersibility in a resin, which may affect the properties of a light-emitting element.

The lower limit of the alkaline earth metal content of the phosphor matrix is preferably 30% by weight. The upper limit thereof is preferably 80% by weight. If the alkaline earth metal content of the phosphor matrix is outside the range, the phosphor may become instable or may be difficult to be prepared.

The lower limit of the silicon content of the phosphor matrix is preferably 5.0% by weight. The upper limit thereof is preferably 25.0% by weight. If the silicon content of the phosphor matrix is outside the range, the phosphor may become instable or may be difficult to be prepared.

The surface treated phosphor of the present invention includes a surface treatment layer including an alkaline earth metal, silicon, and a specific element belonging to groups 4 to 6 of the periodic table, on the surface of the phosphor matrix.

The surface treatment layer includes the alkaline earth metal, silicon, and specific element.

The surface treatment layer including an alkaline earth metal improves water resistance during treatment and adhesion between the surface treatment layer and the phosphor matrix.

The alkaline earth metal is present in the surface treatment layer preferably in the form of hydroxide, oxide, silicate, or fluoride, more preferably in the form of hydroxide or oxide, and particularly preferably in the form of oxide.

The surface treatment layer including silicon improves moisture resistance during surface treatment and use. The silicon is preferably present in the form of oxide or silicate.

Further, the surface treatment layer containing a specific element improves long-term moisture resistance. This is considered due to stability of an oxide of the specific element. The addition of the specific element allows the formation of an oxide layer that is more stable toward water, resulting in excellent moisture resistance during long-term use.

The specific element is at least one element selected from the group consisting of the elements belonging to groups 4 to 6 of the periodic table. Preferable among them are the elements belonging to groups 4 and 5 of the periodic table. Specifically, zirconium, titanium, hafnium, niobium, vanadium, tantalum, and combinations of these elements are preferable.

The specific element is present in the surface treatment layer preferably in the form of hydroxide or oxide, and particularly preferably in the form of oxide. Examples of the oxide of the specific element include zirconium oxide, titanium oxide, hafnium oxide, niobium oxide, vanadium oxide, and tantalum oxide. Particularly, zirconium oxide and titanium oxide are preferable.

The lower limit of the specific element content of the surface treatment layer is preferably 5.0% by weight. The upper limit thereof is preferably 85% by weight. A specific element content of less than 5.0% by weight may cause insufficient long-term stability of moisture resistance. A specific element content exceeding 85% by weight may cause degradation of the phosphor properties of the surface treated phosphor.

The thickness of the surface treatment layer is preferably 0.5 to 5000 nm, more preferably 1.0 to 3000 nm, still more preferably 5.0 to 1000 nm, and particularly preferably 10 to 500 nm. Too small a thickness of the surface treatment layer may cause insufficient moisture resistance. On the other hand, too large a thickness of the surface treatment layer may cause degradation of fluorescence properties of the surface treated phosphor.

The surface treatment layer may include fluorine in addition to an alkaline earth metal, silicon, and a specific element.

If the surface treatment layer contains fluorine, the specific element may be present in the form of hydroxide or acid fluoride ($Ti(O,F)_2$) in which part of oxygen is replaced by fluorine.

With respect to the surface treated phosphor of the present invention, when element distribution of the surface treatment layer in the thickness direction viewed in cross-section is determined by electron microscopy and energy dispersive X-ray spectroscopy coupled therewith, the position representing the maximum peak of a specific element content is located closer to the surface than the position representing the maximum peak of a silicon content.

In "electron microscopy and energy dispersive X-ray spectroscopy coupled therewith", a method is used in which for example SEM-EDS (Scanning Electron Microscopy/Energy Dispersive Spectroscopy) equipment or TEM-EDS (Transmission Electron Microscopy/Energy Dispersive Spectroscopy) equipment is used.

In the present invention, the requirement that "the position representing the maximum peak of a specific element content is located closer to the surface than the position representing the maximum peak of a silicon content" is satisfied even when plural "maximum peaks of a specific element content" or plural "maximum peaks of a silicon content" are present.

In the present invention, "the maximum peak of a specific element content" and "the maximum peak of a silicon content" meeting the above requirement suppress decomposition and deterioration of a phosphor by water during covering and give a surface treated phosphor after covering excellent moisture resistance.

In the element distribution of the surface treatment layer in the thickness direction viewed in cross-section, the lower limit of the specific element content at the maximum peak position is preferably 1.0% by weight, more preferably 5.0% by weight, and particularly preferably 10% by weight. The upper limit thereof is preferably 85% by weight, more preferably 75% by weight, and particularly preferably 65% by weight. Within the above ranges, a phosphor with less deterioration also in long-term use is obtainable.

In the element distribution of the surface treatment layer in the thickness direction viewed in cross-section, the lower limit of the silicon content at the maximum peak position is preferably 5.0% by weight. The upper limit thereof is preferably 60% by weight. Within the above range, the decomposition and deterioration of a phosphor by water during covering treatment may be suppressed and the moisture resistance of the surface treated phosphor may be improved. The lower limit thereof is more preferably 10% by weight and the upper limit is more preferably 50% by weight.

In the present invention, the surface treatment layer is preferably a single layer and silicon is preferably detected at the maximum peak position of a specific element in the element distribution of the surface treatment layer in the thickness direction viewed in cross-section. This improves affinity of the phosphor after covering treatment with an sealing resin, resulting in an improvement in dispersibility of the phosphor in the sealing resin.

The lower limit of the silicon content at the maximum peak position of the specific element is preferably 0.1% by weight and more preferably 0.5% by weight. The upper limit thereof is preferably 30% by weight and more preferably 15% by weight.

In the surface treatment layer of the surface treated phosphor of the present invention, the silicon contents of the phosphor matrix and the surface treatment layer satisfy the formula (1).

When the silicon contents satisfy the formula (1), the silicon content of the surface treatment layer is higher than that of the phosphor matrix, resulting in an improvement in resistance to water or moisture.

Further, $S_1$ is preferably ¾ or less of $S_2$. $S_1$ exceeding ¾ of $S_2$ may cause insufficient moisture resistance.

The difference between $S_2$ and $S_1$, i.e., the value $(S_2–S_1)$, is preferably 0.5 to 50% by weight and more preferably 2 to 40% by weight. When the value $(S_2–S_1)$ is less than 0.5% by weight, moisture resistance may become insufficient. When it exceeds 50% by weight, the proportion of the specific element in the surface treatment layer decreases and the long-term stability of moisture resistance may decrease.

In the present invention, the silicon content $(S_1)$ of the phosphor matrix is represented by an average value of the silicon content in cases where element distribution of the phosphor matrix in a cross-sectional direction is determined by electron microscopy and energy dispersive X-ray spectroscopy coupled therewith.

Further, the silicon content $(S_2)$ of the surface treatment layer is represented by a silicon content at the maximum peak position of a surface treatment layer in cases where element distribution of the surface treatment layer in the thickness direction viewed in cross-section is determined by electron microscopy and energy dispersive X-ray spectroscopy coupled therewith.

The silicon content may be measured using an energy dispersive X-ray spectrometer (EDX) coupled with a field emission transmission electron microscope.

The surface treatment layer is preferably a single layer. This can be confirmed by for example the energy dispersive X-ray spectroscopy in which curves of the specific element content and silicon content are continuously and gradually upward sloping or downward sloping at parts other than the peaks and no rapid change in the contents due to an interface between layers is observed. Such a structure contributes largely to the adhesion of the surface treatment layer and the structure is less likely to cause a problem of delamination compared to a laminate structure made by a physical method.

The surface treatment layer may include an intermediate layer and a surface layer formed in the noted order from inside toward the outermost surface.

In this case, the alkaline earth metal content of each layer preferably satisfies the formulae (2) and (3).

[Formula 2]

$$C_2 < C_1 \quad (2)$$

$$C_2 < C_3 \quad (3)$$

FIG. 25 schematically shows a cross-section of a surface treated phosphor including an intermediate layer and a surface layer.

As shown in FIG. 25, an intermediate layer 2 is formed on the outer surface of a phosphor matrix 1, and further a surface layer 3 is formed on the outer surface of the intermediate layer 2.

With respect to the surface treated phosphor including the intermediate layer and the surface layer, the alkaline earth metal contents of the phosphor matrix 1, the intermediate layer 2, and the surface layer 3 preferably satisfy the formulae (2) and (3).

When the contents satisfy the formulae (2) and (3), the alkaline earth metal content of the intermediate layer 2 is relatively low and the moisture resistance of the phosphor can be improved. Further, the dispersibility is also improved.

$C_2$ is preferably ⅔ or less of $C_1$. This is because the intermediate layer 2 substantially becomes a Si- and O-rich layer and moisture resistance of the surface treated phosphor is improved. $C_2$ exceeding ⅔ of $C_1$ causes insufficient moisture resistance. $C_2$ is more preferably ⅓ or less of $C_1$.

In the present invention, the alkaline earth metal contents of the phosphor matrix, the intermediate layer, or the surface layer are each represented by the alkaline earth metal content (% by weight) based on all the elements constituting the corresponding layer.

The alkaline earth metal contents of the phosphor matrix, the intermediate layer, and the surface layer may be measured using an energy dispersive X-ray spectrometer (EDX) coupled with a field emission transmission electron microscope.

The intermediate layer preferably contains an alkaline earth metal, and the alkaline earth metal content thereof is preferably lower than that of the phosphor matrix and the surface layer. The low alkaline earth metal content means that the amount of a metal other than an alkaline earth metal is large. For example, if the surface of the phosphor matrix having the structure of $M_2SiO_4$ or $M_3SiO_5$ is chemically modified and the surface layer and the intermediate layer are formed thereon, the alkaline earth metal content of the intermediate layer is lower than that of the phosphor matrix. As a result, the intermediate layer is poor in an alkaline earth metal, resulting in a Si- and O-rich layer.

The formation of such an intermediate layer prevents degradation of a phosphor by water in covering treatment. In cases where a phosphor with less moisture resistance is treated, use of an aqueous solution needs to be generally prevented. For example, a silicate phosphor is likely to be decolored and deteriorated in pure water within a few minutes. Therefore, surface treatment by a wet method such as a sol-gel method is usually carried out in an organic solvent such as an alcohol.

On the other hand, in the present invention, even if covering treatment is carried out in a 100% aqueous solution, the phosphor is not decolored and deteriorated by water. The reason for this is not necessarily clear, but it is considered that the intermediate layer with a low alkaline earth metal content is formed at an early stage of covering treatment, and whereby deterioration by water during covering treatment is suppressed. By performing the covering treatment in an aqueous solution, a liquid waste disposal problem caused by use of an organic solvent can be eliminated and cost savings can be achieved.

Further, the formation of the intermediate layer with a low alkaline earth metal content increases the stability to water and improves moisture resistance during use of the surface treated phosphor.

The lower limit of the alkaline earth metal content of the intermediate layer is preferably 0.01% by weight. The upper limit thereof is preferably 40% by weight. If the alkaline earth metal content of the intermediate layer is outside the range, the phosphor may decompose and deteriorate by water during covering treatment.

The thickness of the intermediate layer is not particularly limited and is usually preferably 0.5 to 2000 nm, more preferably 1 to 1000 nm, and still more preferably 2 to 500 nm. Too small a thickness of the intermediate layer may cause an insufficient deterioration prevention effect against water. On the other hand, too large a thickness of the intermediate layer may cause an adverse effect on the fluorescence properties of the phosphor.

The surface layer preferably includes a large amount of a specific element belonging to groups 4 to 6 of the periodic table and silicon in addition to an alkaline earth metal.

The forms of an alkaline earth metal, a specific element belonging to groups 4 to 6 of the periodic table, and silicon in the surface layer are not determined. These elements are preferably present in the form of fluoride, oxide, or multiple oxide. Particularly, an alkaline earth metal is preferably in the form of fluoride and a specific element belonging to groups 4 to 6 of the periodic table and silicon are preferably in the form of oxide. A multiple oxide (for example, barium titanate ($BaTiO_3$)) or the like may be formed between the alkaline earth metal and a metal other than the alkaline earth metal.

The fluoride, oxide, or multiple oxide has moisture resistance higher than that of a silicate of an alkaline earth metal. Therefore, the moisture resistance is further improved by the formation of the surface layer. Particularly, an oxide of Ti, Zr, or silicon has water resistance higher than that of a fluoride of an alkaline earth metal. Therefore, the higher the metal content, the better the surface layer.

The lower limit of the alkaline earth metal content of the surface layer is preferably 1.0% by weight. The upper limit thereof is preferably 60% by weight. If the alkaline earth metal content is less than 1.0% by weight or the alkaline earth metal content exceeds 60% by weight, the water resistance of the phosphor may be insufficient.

The alkaline earth metal present in the surface layer is preferably an alkaline earth metal derived from the phosphor matrix. The phrase "derived from the phosphor matrix" means that a part (usually outermost surface) of constituents of a phosphor matrix crystal is modified by chemical treatment, and the structure or composition of the phosphor matrix crystal is converted into different one.

The thickness of the surface layer is not particularly limited and is usually preferably 0.5 to 2000 nm, more preferably 1.0 to 1000 nm, and still more preferably 2.0 to 500 nm. Too small a thickness of the surface layer may cause an insufficient deterioration preventive effect. On the other hand, too large a thickness thereof may cause an adverse effect on the fluorescence properties of the phosphor.

The surface treated phosphor of the present invention preferably has an electric conductivity of water of 100 mS/m or lower when 1.0 part by weight thereof is immersed in 300 parts by weight of pure water for 10 minutes.

The 100 mS/m or less of an electric conductivity of water causes less decomposition and deterioration of the phosphor by water, resulting in excellent moisture resistance.

The electric conductivity of water may be measured for example with a conductivity meter.

The surface treated phosphor of the present invention may be produced for example by a method including forming a surface treatment layer by dispersing a phosphor matrix in a solution that includes a complex ion containing a specific element and fluorine to bring the phosphor matrix into contact with the solution. The method of producing the surface treated phosphor is also one aspect of the present invention.

An example of the complex ion containing a specific element and a fluorine ion includes a complex ion having the structure of $AF_6^{2-}$ (A: at least one specific element selected from the group consisting of elements belonging to groups 4 to 6 of the periodic table).

Additionally, a complex ion having the structure of $AO_2F_4^{2-}$ or a fluorine-containing solution in which the oxide of a specific element is dissolved may be used.

The surface treatment layer that constitutes the surface treated phosphor of the present invention may be formed for example by a method including forming a surface treatment layer by dispersing a phosphor matrix in a solution that contains a $AF_6^{2-}$ (A: at least one specific element selected from the group consisting of elements belonging to groups 4 to 6 of the periodic table) complex ion to bring the phosphor matrix into contact with the solution.

The concentration of the $AF_6^{2-}$ complex ion is preferably 0.0005 to 2.0 M, more preferably 0.001 to 1.5 M, and still more preferably 0.005 to 1.0 M.

The $AF_6^{2-}$ complex ion gradually undergoes a hydrolysis reaction in an aqueous solution, and finally, as shown in the following formula (8), $AO_2$ is formed. The reaction in the formula (8) proceeds slowly even if no phosphor is present in the solution, whereby oxide particles are formed. However, an experiment conducted by the inventors has shown that when the phosphor is present, an $AO_2$ oxide is preferentially deposited on the surface of the phosphor matrix.

As shown in the following formula (9), the hydrolysis reaction is accelerated in the presence of a compound (hydrolysis accelerator) which can be formed into a complex with a fluorine ion. A hydrolysis accelerator used in the present invention may be selected from compounds containing boron (B) or aluminum (Al). The boron-containing compound and the aluminum-containing compound may be used alone, or two or more of these may be used in combination.

$$AF_6^{2-} + 2H_2O \rightarrow AO_2 + 4H^+ + 6F^- \qquad (8)$$

$$BO_3^{3-} + 6H^+ + 4F^- \rightarrow BF_4^- + 3H_2O \qquad (9)$$

Examples of the boron-containing compound include boron oxide, sodium tetraborate, and boric acid ($H_3BO_3$). Among these, boric acid is preferable.

Examples of the aluminum-containing compound include $AlCl_3$, $AlBr_3$, and aluminum hydroxide ($Al(OH)_3$).

The amount of the hydrolysis accelerator relative to that of the $AF_6^{2-}$ complex ion is not particularly limited, and is usually 5 times or less and more preferably 4 times or less of 1 mol of the $AF_6^{2-}$ complex ion.

The reaction time may be appropriately controlled in accordance with reaction conditions such as the thickness of a target oxide layer, the concentration of a reaction liquid, and the temperature, and is usually about 5 minutes to about 20 hours and preferably about 10 minutes to about 10 hours.

Generally, under the condition of the same amount of the phosphor matrix charged, the longer the reaction time is, the larger the thickness of the layer is. Too short a reaction time causes defective formation of the surface treatment layer. On the other hand, too long a reaction time causes cost inefficiency.

The reaction temperature may be appropriately controlled in accordance with the thickness of a target oxide layer, and may be usually about 0 to 90° C., preferably 5 to 70° C., and more preferably 10 to 50° C.

The dispersion conditions during the reaction are not particularly limited as long as the phosphor can be dispersed. For example, the phosphor may be dispersed by stirring with a magnetic stirrer or a mechanical stirrer with a motor, gas burbling, liquid circulation, ultrasonic dispersion, or rotatory dispersion using a ball mill or a rotary mixer, or combinations of these methods.

The surface treatment layer including the intermediate layer and the surface layer can be formed by the method including forming a surface treatment layer by dispersing a phosphor matrix in a solution that includes a complex ion containing a specific element and a fluorine ion to bring the phosphor matrix into contact with the solution.

Generally, a multilayer is formed in several steps. But, conventional complicated steps are eliminated in the present invention, and the intermediate layer and the surface layer can be formed in one and the same treatment solution and in one process.

The reaction is carried out for a predetermined time, and the phosphor is subjected to filtration, rinsing, and drying to be collected. They may be dried at an ordinary pressure or a reduced pressure. They may be properly dried at a room temperature to 150° C.

In the method of producing the surface treated phosphor of the present invention, the resulting dried surface treated phosphor may be heat-treated at a temperature of 200 to 600° C.

The surface treated phosphor of the present invention may be added to an epoxy resin and/or a silicone resin to be used in the form of a phosphor-containing resin composition.

The phosphor-containing resin composition is used in a known embodiment and for example, may be injected by a dispenser as paste or may be processed into a tape or sheet form and the tapes or sheets may be laminated.

As the epoxy resin, a known one may be used. For example, the epoxy resin may be produced by allowing a compound containing hydroxyl, carboxyl, or an amine to react with epichlorohydrin in the presence of a basic catalyst (sodium hydroxide and the like) such as a metal hydroxide.

Further, the epoxy resin may be produced by allowing a compound containing one or preferably two or more carbon-carbon double bonds to react with a peroxide (peroxy acid and the like).

Examples of the epoxy resin include an aliphatic epoxy resin, a cycloaliphatic epoxy resin, a bisphenol-A epoxy resin, a bisphenol-F epoxy resin, a phenol novolak epoxy resin, a cresol-novolak epoxy resin, a biphenyl epoxy resin, a 4,4'-biphenyl epoxy resin, a polyfunctional epoxy resin, divinylbenzene dioxide, and 2-glycidyl phenyl glycidyl ether. Preferable among them are a cycloaliphatic epoxy resin and an aliphatic epoxy resin. These epoxy resins may be used alone, or two or more of these may be used in combination.

The aliphatic epoxy resin may be a compound containing one or more aliphatic groups and one or more epoxy groups. Specific examples of the aliphatic epoxy resin include butadiene dioxide, dimethyl pentane dioxide, diglycidyl ether, 1,4-butanediol diglycidyl ether, diethylene glycol diglycidyl ether, and dipentene dioxide.

The cycloaliphatic epoxy resin may be a compound containing one or more alicyclic groups and one or more oxirane groups. Specific examples of the cycloaliphatic epoxy resin include 2-(3,4-epoxy)cyclohexyl-5,5-spiro-(3,4-epoxy)cyclohexane-m-dioxane, 3,4-epoxycyclohexylalkyl-3,4-epoxycyclohexane carboxylate, 3,4-epoxy-6-methylcyclohexylmethyl-3,4-epoxy-6-methylcyclohexane carboxylate, vinylcyclohexane dioxide, bis(3,4-epoxycyclohexylmethyl)adipate, bis(3,4-epoxy-6-methylcyclohexylmethyl)adipate, exo-exo bis(2,3-epoxycyclopentyl)ether, endo-exo bis(2,3-epoxycyclopentyl)ether, 2,2-bis(4-(2,3-epoxypropoxy)cyclohexyl)propane, 2,6-bis(2,3-epoxypropoxycyclohexyl-p-dioxane), 2,6-bis(2,3-epoxypropoxy)norbornene, and diglycidyl ether of linolic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindan, p-(2,3-epoxy)cyclopentyl phenyl-2,3-epoxypropyl ether, 1-(2,3-epoxypropoxy)phenyl-5,6-epoxyhexahydro-4,7-methanoindan, o-(2,3-epoxy)cyclopentyl phenyl-2,3-epoxypropyl ether, 1,2-bis[5-(1,2-epoxy)-4,7-hexahydro methano indanoxyl]ethane, cyclopentyl phenyl glycidyl ether, cyclohexanediol diglycidyl ether, and diglycidyl hexahydro phthalate.

As the silicone resin, a known one may be used. For example, the silicone resin preferably may be one having a polysiloxane skeleton represented by $(-SiR^1R^2-O-)_n$. $R^1$ is preferably one containing 2 to 10 carbon atoms and particularly preferably one containing 2 to 6 carbon atoms. Examples thereof include an alkenyl group such as a vinyl group, an allyl group, a propenyl group, an isopropenyl group, and a butenyl group; an acryloxy group; and a methacryloxy group. $R^2$ is preferably one containing 1 to 10 carbon atoms and particularly preferably one containing 1 to 6 carbon atoms. Examples thereof include an alkyl group such as a methyl group, an ethyl group, a propyl group, a butyl group, and a cyclohexyl group; an aryl group such as a phenyl group and a tolyl group; and an aralkyl group such as a benzyl group.

The surface treated phosphor of the present invention may be dispersed in at least one resin selected from the group consisting of resins of polyvinyl acetate, polyvinyl butyral, polyethylene, polypropylene, polymethylmethacrylate, polycarbonate, and a cyclic olefin copolymer to be used in the form of a wavelength converting composite.

The wavelength converting composite is used as a wavelength conversion material for a lighting system, a solar cell, or the like.

The method of producing the wavelength converting composite is not particularly limited. The surface treated phosphor of the present invention may be subjected to known surface treatment according to the corresponding resin. The phosphor may be dispersed in the resin by a known kneading and dispersing method.

The wavelength converting composite formed into a sheet shape can be used as a wavelength converting sheet. The method of forming the sheet-like wavelength converting composite may be a known method. Specific examples of the method include a method in which a masterbatch is prepared from the surface treated phosphor of the present invention and a resin, and a film is formed from the masterbatch using an extruder; and a method in which a resin and the surface treated phosphor of the present invention are dispersed in a solution capable of dissolving the resin, and the solution is cast.

An efficient photoelectric converter is obtainable using the wavelength converting composite or the wavelength converting sheet of the present invention. Such a photoelectric converter is also one aspect of the present invention.

The photoelectric converter represented by a solar cell receives light whose wavelength is not always efficient to an element itself. In this case, the wavelength of received light is converted into a wavelength efficient for the element to improve the conversion efficiency of the photoelectric converter.

A conventional phosphor cannot be suitably used because of its low moisture resistance. However, an efficient solar cell is obtainable by using the surface treated phosphor of the present invention dispersed in a sealing resin on the surface of a solar cell.

A semiconductor light-emitting element can be produced by forming a phosphor layer using the surface treated phosphor of the present invention. Such a semiconductor light-emitting element is also one aspect of the present invention.

In an LED device including an LED chip; a resin flame surrounding the LED chip; and a layer of a phosphor filling a concave portion defined by the resin flame, the layer of a phosphor includes the surface treated phosphor of the present invention and an sealing resin. Such an LED device can be excellent in moisture resistance. Such an LED device is also one aspect of the present invention.

The LED device of the present invention keeps retention of brightness of 80% or higher after electricity is supplied to the device for 1000 hours under conditions at a temperature of 60° C., relative humidity of 90%, and an electricity of 20 mA. Retention of brightness of lower than 80% may cause a reduction in emission intensity with time during actual use, resulting in insufficient durability. The retention of brightness is preferably 90% or higher.

The retention of brightness represents a ratio of brightness before and after electricity is supplied under the above-described conditions [(brightness after electricity is supplied/brightness before electricity is supplied)×100]. The brightness may be determined for example using an OL770 measurement system manufactured by Optronic Laboratories, Inc.

The LED device of the present invention preferably keeps retention of brightness of 80% or higher after it is aged for 72 hours under conditions at a temperature of 121° C. and a relative humidity of 100%.

Use of the LED device of the present invention is not particularly limited and the device may be used in various fields in which a common LED device is used. The LED device may be used alone, or two or more of the devices may be used in combination. Specifically, the LED device may be used for example for a backlight for liquid crystal display element, an image display device, and lighting equipment.

The configuration as the backlight for liquid crystal display element may be a known one. For example, the backlight for liquid crystal display element may be arranged on the frame of the display element and emit light toward a light guide plate or may be arranged on the back of a diffusion plate that is arranged on the back of a liquid crystal cell.

One example of the image display device includes a liquid crystal display element having at least a liquid crystal cell and the backlight for liquid crystal display element. Other examples thereof include an LED display that creates an image by the selective emission of LEDs that are two-dimensionally and regularly arranged.

Further, the lighting equipment is not particularly limited and may be applied to a known LED device. The lighting equipment has high moisture resistance. Therefore, they may be used as indicating lights used for traffic of vehicles and transportation, illuminating lamps, interior and exterior lights used for houses and buildings; and lights used for cell-phones and mobile telecom terminals.

Advantageous Effects of Invention

According to the present invention, a surface treated phosphor excellent in moisture resistance is obtainable in which the surface is prevented from the decomposition and deterioration by moisture and water in the air and the brightness does not decrease and the color tone does not change even when the phosphor is used for a long time or under high temperature and high humidity conditions. According to the method of producing the surface treated phosphor of the present invention, there is no need for an expensive reactor and covering treatment can be carry out in an aqueous solution in a short time. Therefore, the target surface treated phosphor can be efficiently and economically produced.

DESCRIPTION OF EMBODIMENTS

Hereinafter, the embodiments of the present invention will be described in more detail based on examples. The present invention is not limited to those examples.

Example 1

As a phosphor matrix, a green silicate phosphor (25 g) with a median particle size ($D_{50}$) of about 16 μm (main component: $(Sr,Ba)_2SiO_4:Eu^{2+}$, emission wavelength: 529 nm) was added to a mixed aqueous solution (500 ml) including 0.1 mol/L ammonium fluorotitanate ($(NH_4)_2TiF_6$) and 0.1 mol/L boric acid. The resulting mixture was stirred to sufficiently disperse the phosphor and the reaction was carried out at 35° C. for two hours. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the following method.

The results show that an about 53-nm-thick surface treatment layer is formed on the surface of each phosphor matrix.

Figure 1:
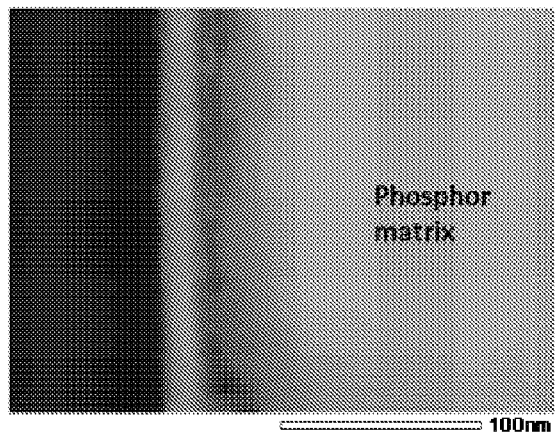
FIG. 1 is a photograph of a cross-section of a surface treated phosphor obtained in Example 1.
Figure 2:
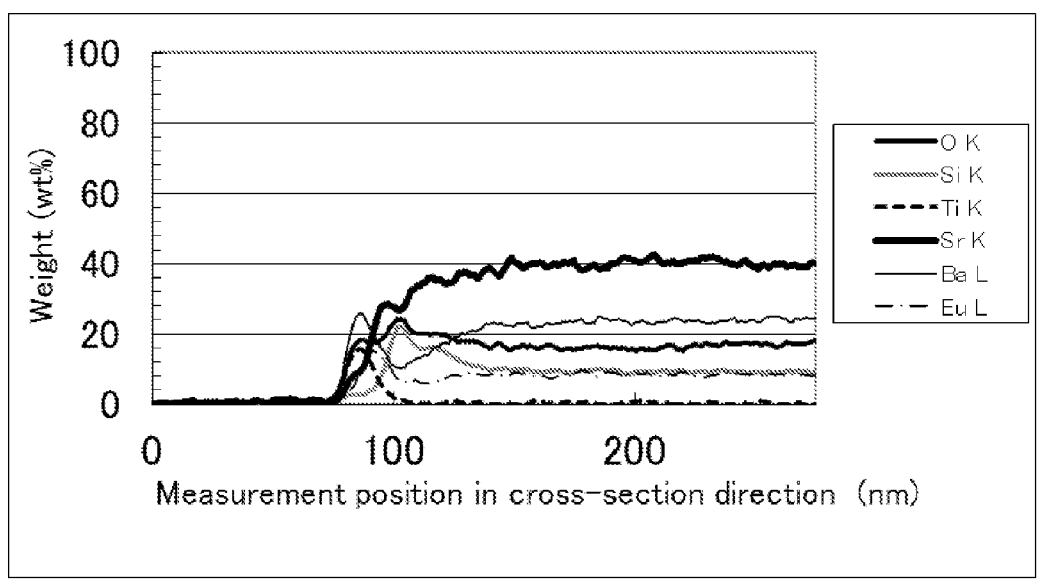
FIG. 2 shows all element distribution data of the surface treated phosphor in the cross-sectional direction obtained in Example 1.
Figure 3:
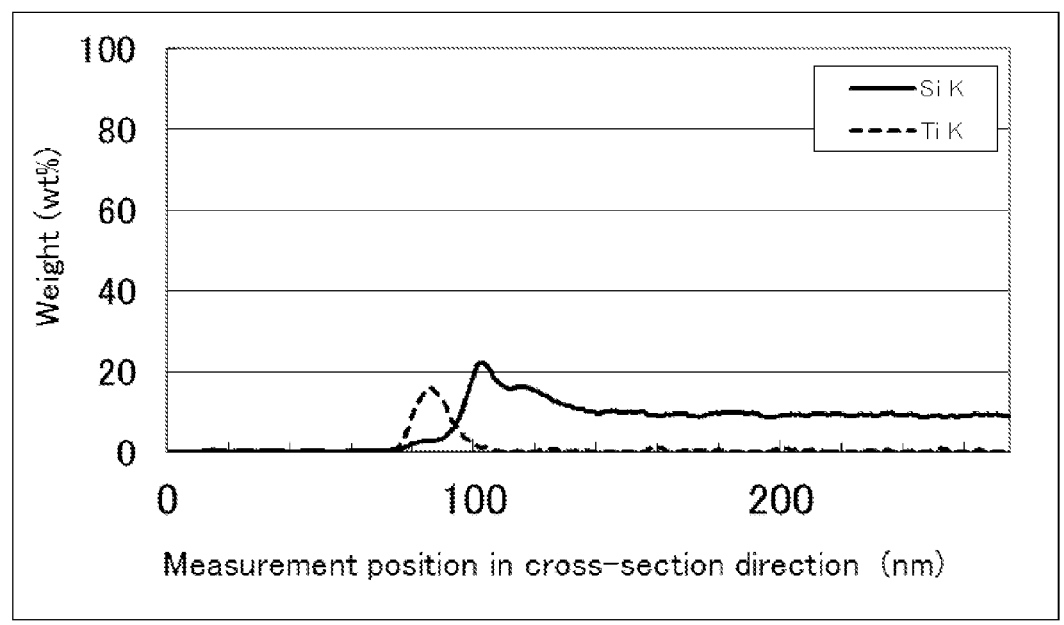
FIG. 3 shows element distribution data of the surface treated phosphor in the cross-sectional direction obtained in Example 1.

With respect to the surface treated phosphor, FIG. 1 shows an FE-TEM cross-section photograph obtained by elemental composition analysis in the cross-sectional direction. FIGS. 2 and 3 show the results of the elemental analysis in the cross-sectional direction.

FIG. 2 shows the results of all the detected elements. FIG. 3 shows only the results of a specific element and silicon. In actual measurement, in order to prevent charge at the time of analysis, vacuum evaporation of carbon (C) was performed. However, since C is not present in the surface treated phosphor, no C peak is observed in FIG. 2.

The elemental composition analysis in the cross-sectional direction provided elemental composition curves showing a titanium content and a silicon content. These curves showed that the position representing the maximum peak of the titanium content was located closer to the surface than the position representing the maximum peak of the silicon content. The amount of a specific element other than titanium was below the measurable limit.

The silicon content at the maximum peak position of the titanium content was 3.0% by weight.

<Measurement of Thickness of Covering Layer, Elemental Composition Analysis in the Cross-Sectional Direction>

The resulting surface treated phosphor was cut using a focused ion beam (FIB) in the cross-sectional direction and the cross-section was observed with a transmission electron microscope (FE-TEM, JEM-2010FEF) to determine the thickness of the surface treatment layer. The thickness of the surface treatment layer was determined by averaging 5 different points of the thickness.

The elemental composition of the surface treatment layer was analyzed and identified using an energy-dispersive X-ray spectrometer (EDX) coupled with the FE-TEM. Thus, the curves of the specific element (elements belonging to groups 4 to 6 in the periodic table) content and the silicon content in the thickness direction were produced.

Example 2

As a phosphor matrix, a green silicate phosphor (25 g) with a median particle size ($D_{50}$) of about 16 μm (main component: $(Sr,Ba)_2SiO_4:Eu^{2+}$, emission wavelength: 529 nm) was added to an aqueous solution (500 ml) including 1.0 mol/L ammonium fluorotitanate ($(NH_4)_2TiF_6$). The resulting mixture was stirred to sufficiently disperse the phosphor and the reaction was carried out at 35° C. for 10 minutes. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 214-nm-thick surface treatment layer was formed on the surface of the phosphor matrix.

The elemental composition analysis in the cross-sectional direction provided elemental composition curves showing a titanium content and a silicon content. These curves showed that the position representing the maximum peak of the titanium content was located closer to the surface than the position representing the maximum peak of the silicon content. The amount of a specific element other than titanium was below the measurable limit.

The silicon content at the maximum peak position of the titanium content was 5.1% by weight.

Figure 4:
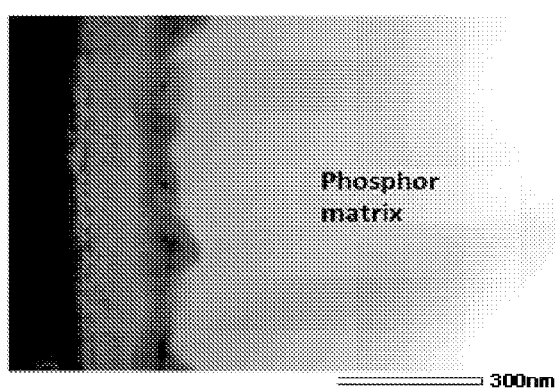
FIG. 4 is a photograph of a cross-section of a surface treated phosphor obtained in Example 2.
Figure 5:
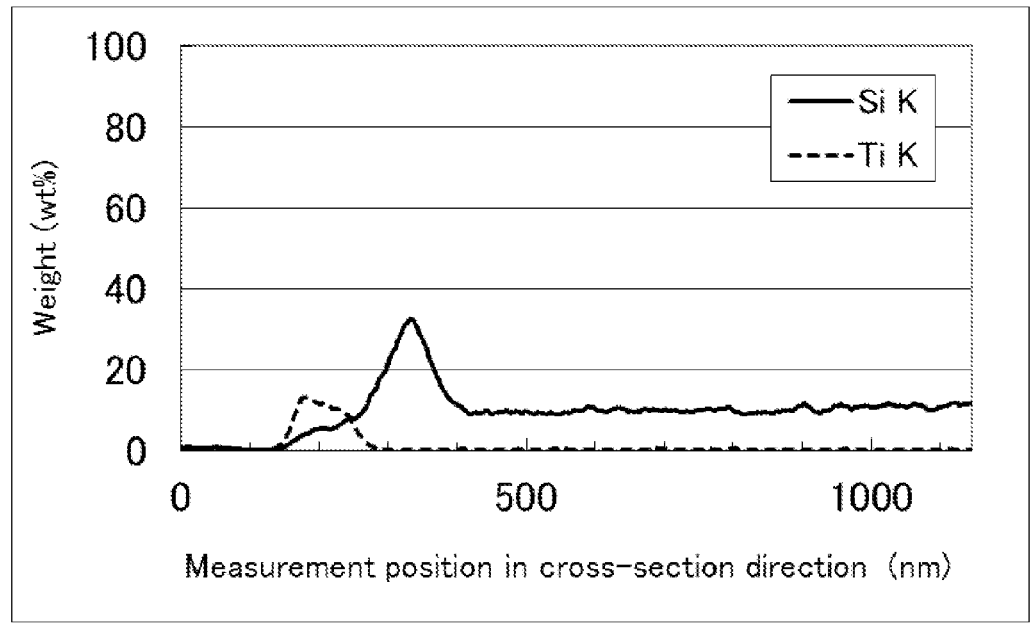
FIG. 5 shows element distribution data of the surface treated phosphor in the cross-sectional direction obtained in Example 2.

FIG. 4 shows an FE-TEM cross-section photograph of the resulting surface treated phosphor. FIG. 5 shows the results of the elemental analysis in the cross-sectional direction.

Example 3

As a phosphor matrix, a green silicate phosphor (2.4 g) with a median particle size ($D_{50}$) of about 16 μm (main component: $(Sr,Ba)_2SiO_4:Eu^{2+}$, emission wavelength: 529 nm) was added to a mixed aqueous solution (500 ml) including 0.05 mol/L ammonium fluorotitanate ($(NH_4)_2TiF_6$) and 0.2 mol/L boric acid. The resulting mixture was stirred to sufficiently disperse the phosphor and the reaction was carried out at 35° C. for two hours. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 35-nm-thick covering layer was formed on the surface of the phosphor matrix.

The elemental composition analysis in the cross-sectional direction provided elemental composition curves showing a titanium content and a silicon content. These curves showed that the position representing the maximum peak of the titanium content was located closer to the surface than the position representing the maximum peak of the silicon content. The amount of a specific element other than titanium was below the measurable limit.

It was confirmed that alkaline earth metal contents of the phosphor matrix, the intermediate layer, and the surface layer satisfied the formulae (2) and (3) (Table 2).

The silicon content at the maximum peak position of the titanium content was 4.2% by weight.

Figure 6:
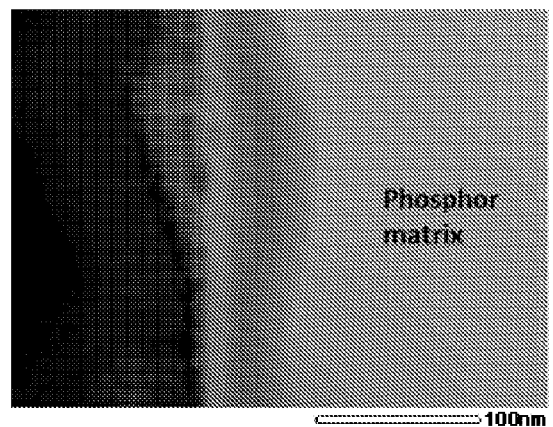
FIG. 6 is a photograph of a cross-section of a surface treated phosphor obtained in Example 3.

FIG. 6 shows an FE-TEM cross-section photograph of the resulting surface treated phosphor.

In Example 3, since an alkaline earth metal is not present in the treatment liquid, it is assumed that an alkaline earth metal detected in the surface treatment layer is derived from the phosphor matrix.

Example 4

As a phosphor matrix, a green silicate phosphor (2.4 g) with a median particle size ($D_{50}$) of about 16 μm (main component: $(Sr,Ba)_2SiO_4:Eu^{2+}$, emission wavelength: 529 nm) was added to a mixed aqueous solution (500 ml) including 0.1 mol/L ammonium fluorozirconate ($(NH_4)_2ZrF_6$) and 0.2 mol/L boric acid. The resulting mixture was stirred to sufficiently disperse the phosphor and the reaction was carried out at 35° C. for two hours. After the reaction, the mixture was subjected to filtration and rinsing to collect the phosphor.

The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 645-nm-thick covering layer was formed on the surface of the phosphor matrix.

The elemental composition analysis in the cross-sectional direction provided elemental composition curves showing a zirconium content and a silicon content. These curves showed that the position representing the maximum peak of the zirconium content was located closer to the surface than the position representing the maximum peak of the silicon content. The amount of a specific element other than zirconium was below the measurable limit.

The zirconium content at the maximum peak position of the silicon content was 3.5% by weight.

It was confirmed that alkaline earth metal contents of the phosphor matrix, the intermediate layer, and the surface layer satisfied the formulae (2) and (3) (Table 2).

Figure 7:
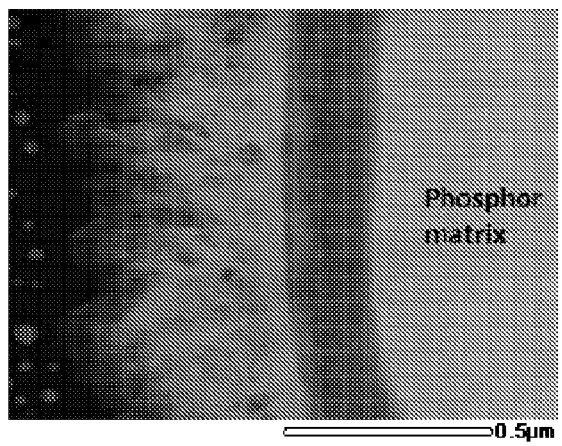
FIG. 7 is a photograph of a cross-section of a surface treated phosphor obtained in Example 4.
Figure 8:
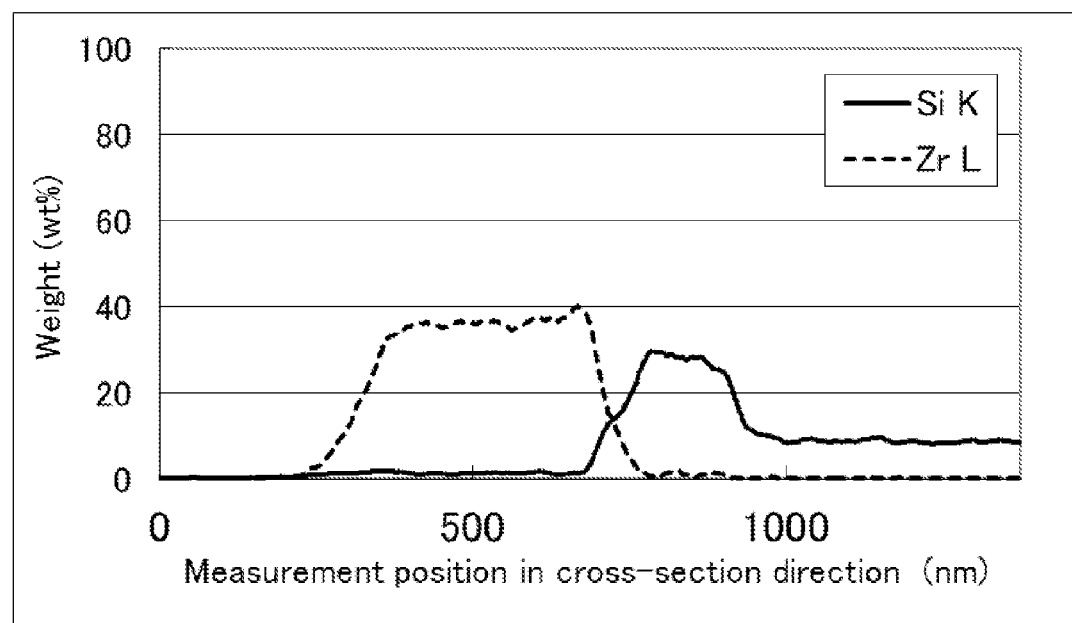
FIG. 8 shows element distribution data of the surface treated phosphor in the cross-sectional direction obtained in Example 4.

FIG. 7 shows an FE-TEM cross-section photograph of the resulting surface treated phosphor. FIG. 8 shows the results of the elemental analysis in the cross-sectional direction.

Example 5

As a phosphor matrix, a green silicate phosphor (7.5 g) with a median particle size ($D_{50}$) of about 16 μm (main component: $(Sr,Ba)_2SiO_4:Eu^{2+}$, emission wavelength: 529 nm) was added to a hydrofluoric acid aqueous solution (500 ml) in which 0.05 mol/L vanadium oxide was dissolved. The resulting mixture was stirred to sufficiently disperse the phosphor and the reaction was carried out at 35° C. for 30 minutes. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 150-nm-thick covering layer was formed on the surface of the phosphor matrix.

The elemental composition analysis in the cross-sectional direction provided elemental composition curves showing a vanadium content and a silicon content. These curves showed that the position representing the maximum peak of the vanadium content was located closer to the surface than the position representing the maximum peak of the silicon content. The amount of a specific element other than vanadium was below the measurable limit.

The silicon content at the maximum peak position of the vanadium content was 0.5% by weight.

Example 6

As a phosphor matrix, a green silicate phosphor (7.5 g) with a median particle size ($D_{50}$) of about 16 μM (main component: $(Sr, Ba)_2SiO_4:Eu^{2+}$, emission wavelength: 529 nm) was added to an aqueous solution (500 ml) of 0.1 mol/L ammonium fluoromolybdate $((NH_4)_2MoO_2F_4)$. The resulting mixture was stirred to sufficiently disperse the phosphor and the reaction was carried out at 35° C. for one hour. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 70-nm-thick covering layer was formed on the surface of the phosphor matrix.

The elemental composition analysis in the cross-sectional direction provided elemental composition curves showing a molybdenum content and a silicon content. These curves showed that the position representing the maximum peak of the molybdenum content was located closer to the surface than the position representing the maximum peak of the silicon content. The amount of a specific element other than molybdenum was below the measurable limit.

The silicon content at the maximum peak position of the molybdenum content was 1.2% by weight.

Example 7

As a phosphor matrix, a green silicate phosphor (25 g) with a median particle size ($D_{50}$) of about 16.5 μm (main component: $(Sr, Ba)_2SiO_4:Eu^{2+}$, emission wavelength: 525 nm) was added to a mixed aqueous solution (500 ml) including 0.1 mol/L ammonium fluorotitanate $((NH_4)_2TiF_6)$ and 0.1 mol/L boric acid. The resulting mixture was stirred to sufficiently disperse the phosphor and the reaction was carried out at 35° C. for two hours. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 58-nm-thick treated surface layer was formed on the surface of the phosphor matrix.

The elemental composition analysis in the cross-sectional direction provided elemental composition curves showing a titanium content and a silicon content. These curves showed that the position representing the maximum peak of the titanium content was located closer to the surface than the position representing the maximum peak of the silicon content. The amount of a specific element other than titanium was below the measurable limit.

Figure 9:
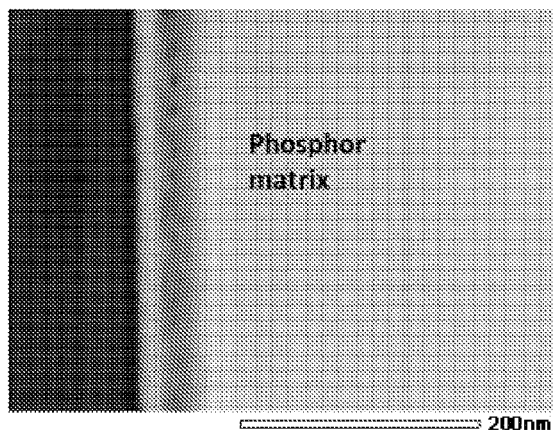
FIG. 9 is a photograph of a cross-section of a surface treated phosphor obtained in Example 7.
Figure 10:
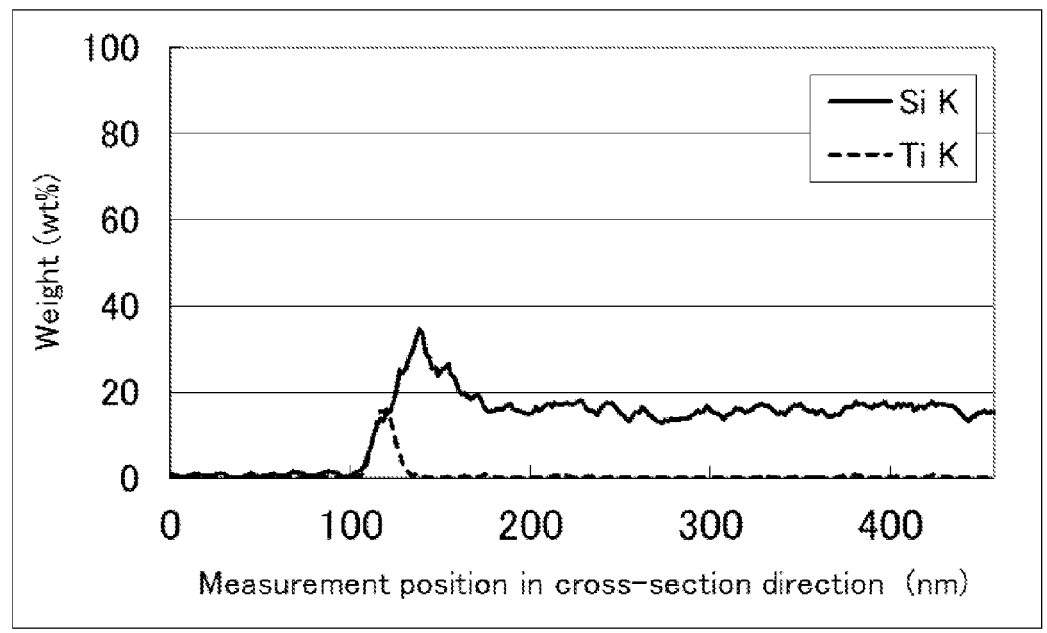
FIG. 10 shows element distribution data of the surface treated phosphor in the cross-sectional direction obtained in Example 7.

The silicon content at the maximum peak position of the titanium content was 14% by weight. FIG. 9 shows an FE-TEM cross-section photograph of the resulting surface treated phosphor. FIG. 10 shows the results of the elemental analysis in the cross-sectional direction.

Example 8

As a phosphor matrix, a yellow silicate phosphor (25 g) with a median particle size ($D_{50}$) of about 15.5 μm (main component: $(Sr,Ba)_2SiO_4:Eu^{2+}$, emission wavelength: 550 nm) was added to a mixed aqueous solution (500 ml) including 0.1 mol/L ammonium fluorotitanate $((NH_4)_2TiF_6)$ and 0.1 mol/L boric acid. The resulting mixture was stirred to sufficiently disperse the phosphor and the reaction was carried out at 35° C. for two hours. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 63-nm-thick covering layer was formed on the surface of the phosphor matrix.

The elemental composition analysis in the cross-sectional direction provided elemental composition curves showing a titanium content and a silicon content. These curves showed that the position representing the maximum peak of the titanium content was located closer to the surface than the position representing the maximum peak of the silicon content. The amount of a specific element other than titanium was below the measurable limit.

The silicon content at the maximum peak position of the titanium content was 9.5% by weight.

It was confirmed that alkaline earth metal contents of the phosphor matrix, the intermediate layer, and the surface layer satisfied the formulae (2) and (3) (Table 2).

Figure 11:
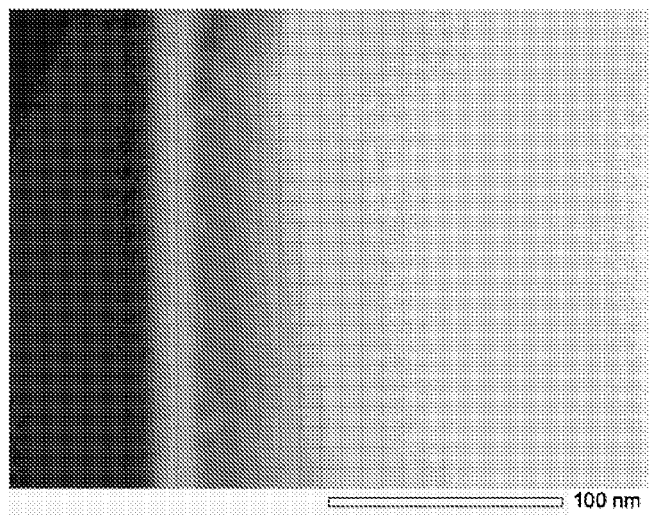
FIG. 11 is a photograph of a cross-section of a surface treated phosphor obtained in Example 8.
Figure 12:
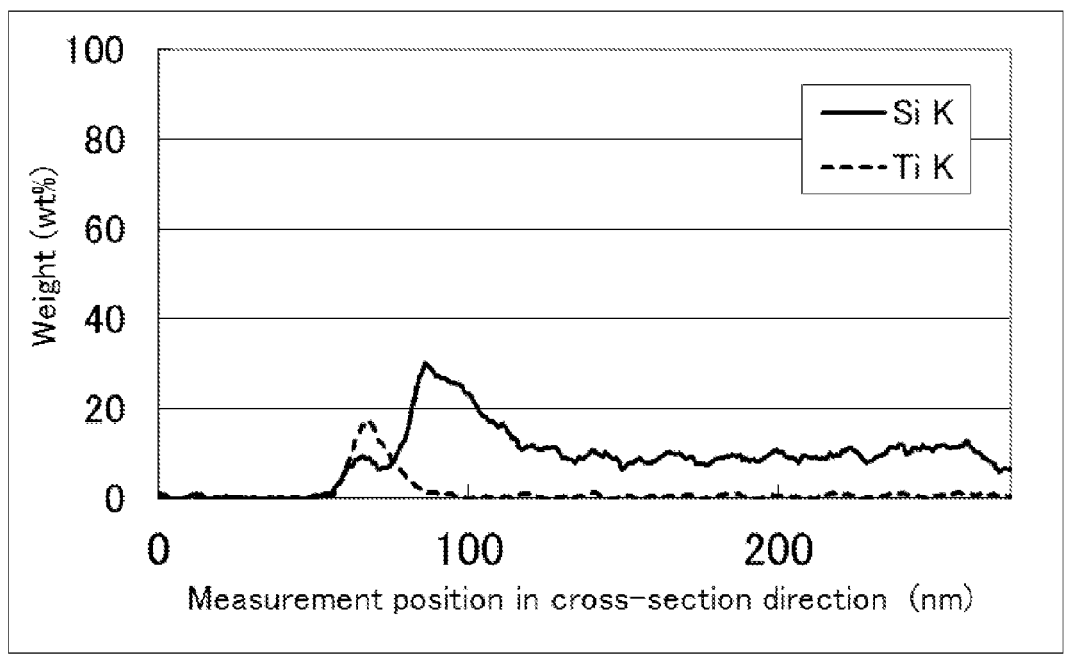
FIG. 12 shows element distribution data of the surface treated phosphor in the cross-sectional direction obtained in Example 8.

FIG. 11 shows an FE-TEM cross-section photograph of the resulting surface treated phosphor. FIG. 12 shows the results of the elemental analysis in the cross-sectional direction.

Example 9

As a phosphor matrix, a yellow silicate phosphor (25 g) with a median particle size ($D_{50}$) of about 15 μm (main component: $(Sr,Ba)_2SiO_4:Eu^{2+}$, emission wavelength: 565 nm) was added to a mixed aqueous solution (500 ml) including 0.1 mol/L ammonium fluorotitanate ($(NH_4)_2TiF_6$) and 0.1 mol/L boric acid. The resulting mixture was stirred to sufficiently disperse the phosphor and the reaction was carried out at 35° C. for two hours. After the reaction, the mixture was subjected to filtration and rinsing to collect the phosphor. The resulting phosphor was vacuum dried at 120° C. for one hour to give a surface treated phosphor.

"Measurement of thickness of covering layer and elemental composition analysis in the cross-sectional direction" were performed on the resulting surface treated phosphor by the same method as Example 1. The result showed that an about 68-nm-thick covering layer was formed on the surface of the phosphor matrix.

The elemental composition analysis in the cross-sectional direction provided composition analysis curves showing a titanium content and a silicon content. These curves showed that the position representing the maximum peak of the titanium content was located closer to the surface than the position representing the maximum peak of the silicon content. The amount of a specific element other than titanium was below the measurable limit.

Figure 13:
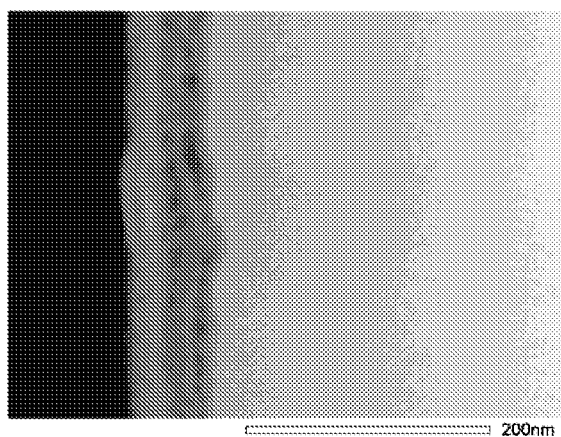
FIG. 13 is a photograph of a cross-section of a surface treated phosphor obtained in Example 9.
Figure 14:
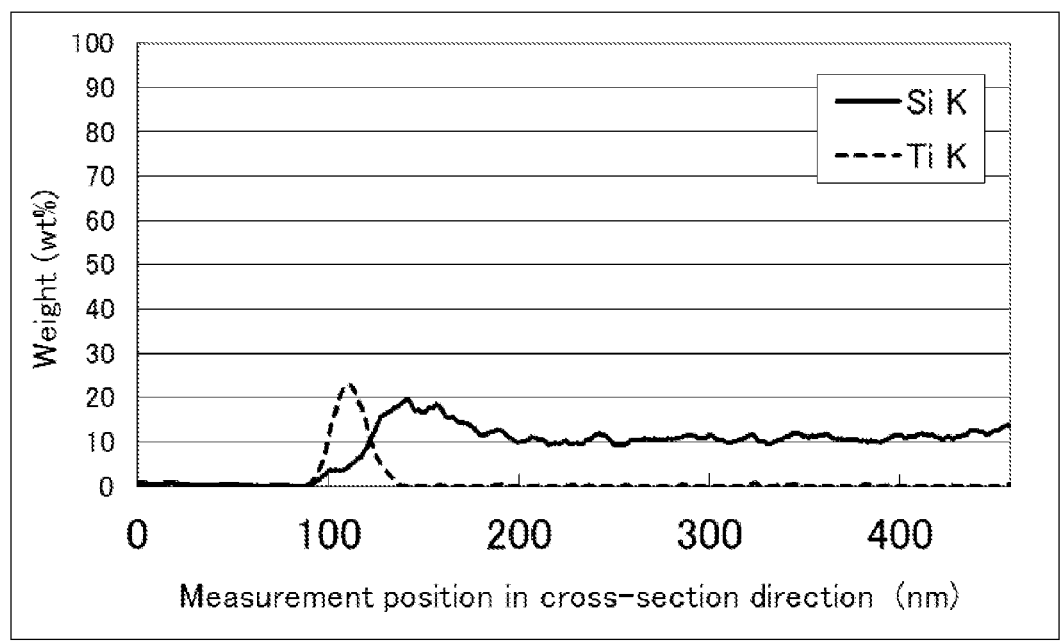
FIG. 14 shows element distribution data of the surface treated phosphor in the cross-sectional direction obtained in Example 9.

The silicon content at the maximum peak position of the titanium content was 4.9% by weight. FIG. 13 shows an FE-TEM cross-section photograph of the resulting surface treated phosphor. FIG. 14 shows the results of the elemental analysis in the cross-sectional direction.

Comparative Example 1

A surface-untreated green silicate phosphor with a median particle size ($D_{50}$) of about 16 μm (main component: $(Sr,Ba)_2SiO_4:Eu^{2+}$, emission wavelength: 529 nm) was used. "Measurement of thickness of covering layer and elemental composition analysis in the cross-sectional direction" were performed on the phosphor by the same method as Example 1. The result showed that no surface covering layer was formed on the surface of the phosphor and no specific element was detected.

Figure 15:
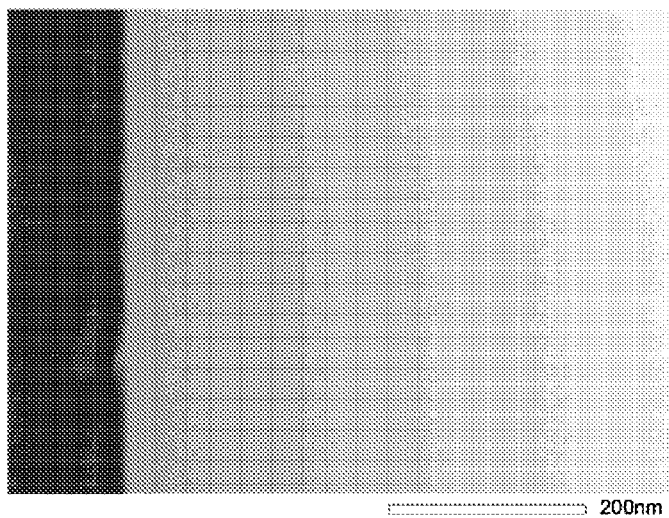
FIG. 15 is a photograph of a cross-section of a surface treated phosphor obtained in Comparative Example 1.
Figure 16:
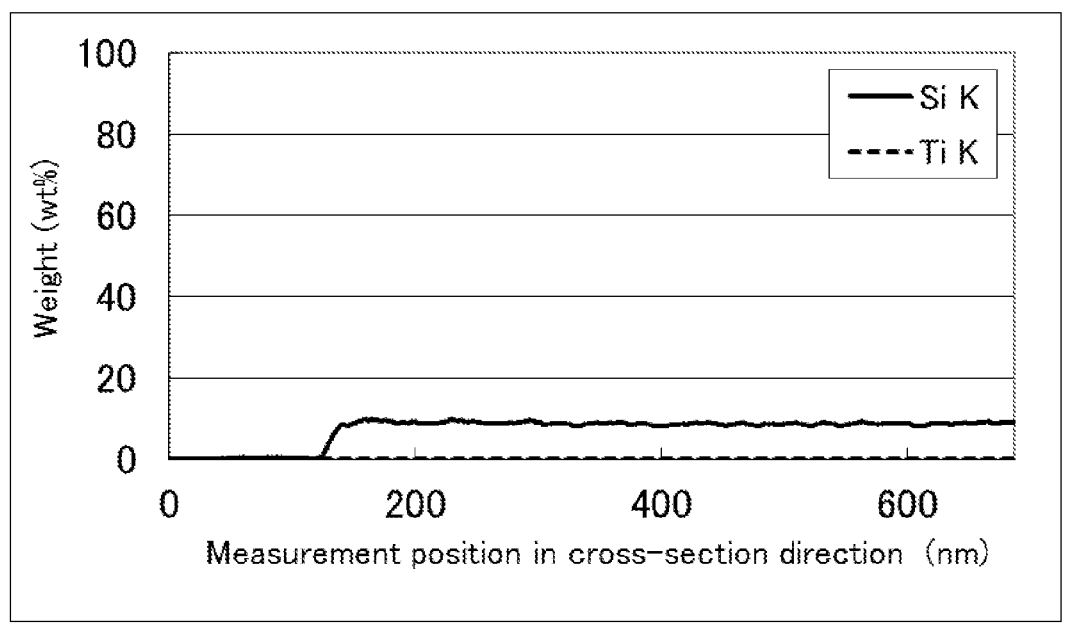
FIG. 16 shows element distribution data of the surface treated phosphor in the cross-sectional direction obtained in Comparative Example 1.

FIG. 15 and FIG. 16 show an FE-TEM cross-section photograph of the resulting phosphor and a silicon analysis curve in the cross-sectional direction, respectively.

Comparative Example 2

A surface-untreated green silicate phosphor with a median particle size ($D_{50}$) of about 16.5 μm (main component: $(Sr,Ba)_2SiO_4:Eu^{2+}$, emission wavelength: 525 nm) was used. "Measurement of thickness of covering layer and elemental composition analysis in the cross-sectional direction" were performed on the phosphor by the same method as Example 1. The result showed that no surface covering layer was formed on the surface of the phosphor and no specific element was detected.

Comparative Example 3

A surface-untreated yellow silicate phosphor with a median particle size ($D_{50}$) of about 15.5 μm (main component: $(Sr,Ba,Ca)_2SiO_4:Eu^{2+}$, emission wavelength: 550 nm) was used. "Measurement of thickness of covering layer and elemental composition analysis in the cross-sectional direction" were performed on the phosphor by the same method as Example 1. The result showed that no surface covering layer was formed on the surface of the phosphor and no specific element was detected.

Figure 17:
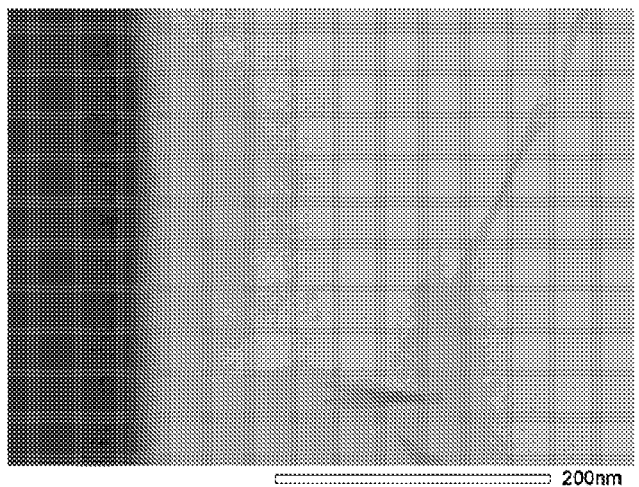
FIG. 17 is a photograph of a cross-section of a surface treated phosphor obtained in Comparative Example 3.
Figure 18:
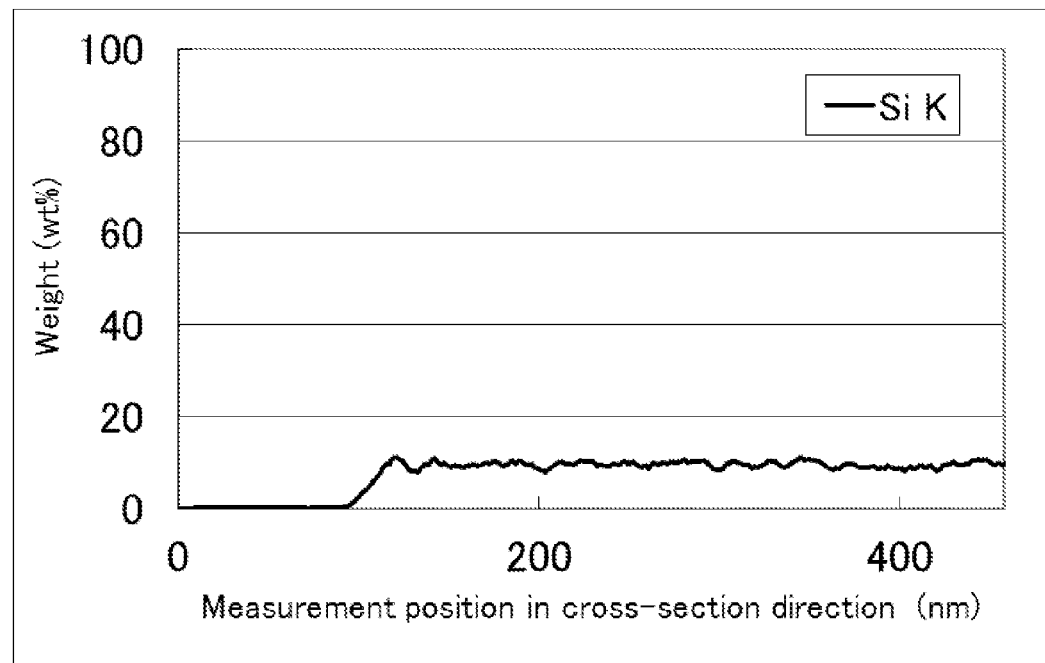
FIG. 18 shows element distribution data of the surface treated phosphor in the cross-sectional direction obtained in Comparative Example 3.

FIG. 17 and FIG. 18 show an FE-TEM cross-section photograph of the resulting phosphor and a silicon analysis curve in the cross-sectional direction, respectively.

Comparative Example 4

A surface-untreated yellow silicate phosphor with a median particle size ($D_{50}$) of about 15 μm (main component: $(Sr,Ba,Ca)_2SiO_4:Eu^{2+}$, emission wavelength: 565 nm) was used. "Measurement of thickness of covering layer and elemental composition analysis in the cross-sectional direction" were performed on the phosphor by the same method as Example 1. The result showed that no surface covering layer was formed on the surface of the phosphor and no specific element was detected.

Comparative Example 5

A green silicate phosphor (3.0 g) including $(Sr,Ba)_2SiO_4:Eu^{2+}$ (emission wavelength: 529 nm) as a main component was dispersed in a mixed solution of ethanol (80 g) and aqueous ammonia (3 g) (15% by weight). A solution 1 to be added (a mixed solution of ethanol (12.5 g) and tetraethoxysilane (2.5 g)) and a solution 2 to be added (5 wt % aqueous ammonia (15 g)) were added dropwise at the same time using different dropping devices at a rate of 0.5 ml/min while the dispersion was maintained at 50° C. After the addition, the mixture was subjected to filtration and rinsing to collect phosphor particles. The resulting phosphor particles were vacuum dried at 120° C. for one hour.

"Measurement of thickness of covering layer and elemental composition analysis in the cross-sectional direction" were performed on the covered phosphor particles by the same method as Example 1. The result showed that an about 55-nm-thick covering layer was formed on the surface.

According to the elemental composition curve provided by the elemental composition analysis in the cross-sectional direction, a peak of silicon derived from the covering layer was observed on the surface.

Figure 19:
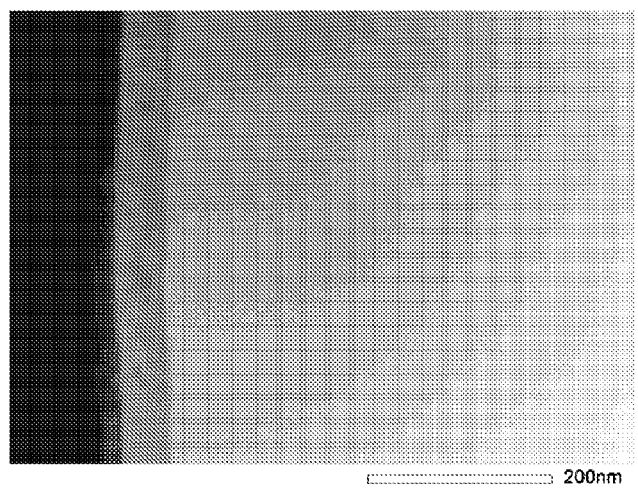
FIG. 19 is a photograph of a cross-section of a surface treated phosphor obtained in Comparative Example 5.
Figure 20:
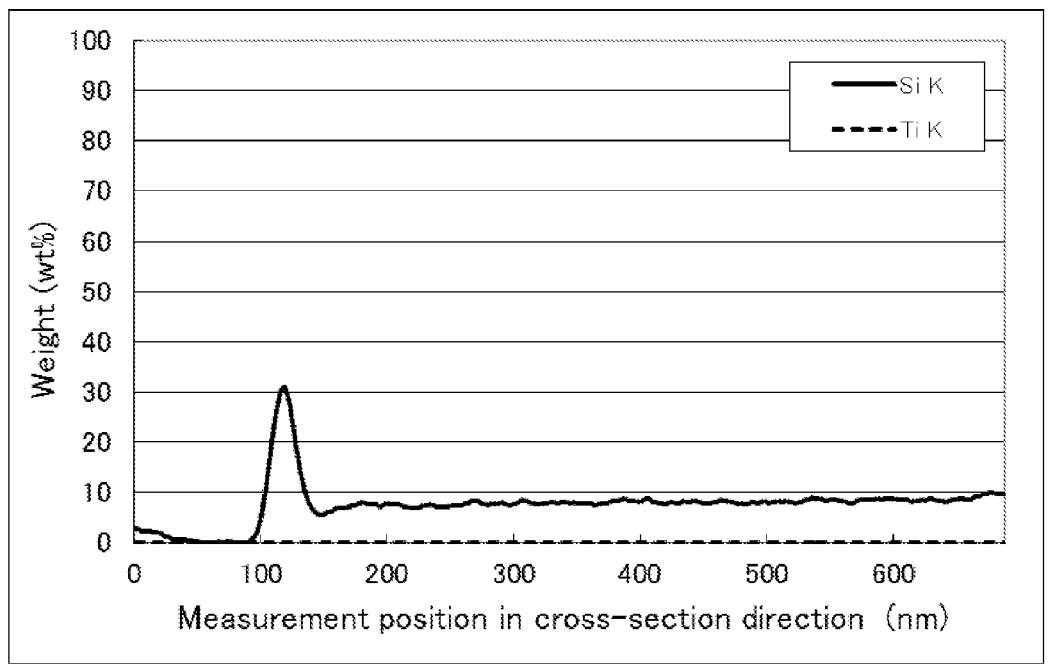
FIG. 20 shows element distribution data of the surface treated phosphor in the cross-sectional direction obtained in Comparative Example 5.

FIG. 19 shows an FE-TEM cross-section photograph of the resulting surface treated phosphor. FIG. 20 shows the results of the elemental analysis in the cross-sectional direction.

Comparative Example 6

A green silicate phosphor (5.0 g) including $(Sr,Ba)_2SiO_4:Eu^{2+}$ (emission wavelength: 529 nm) as a main component was dispersed in a dehydrated ethanol solution (300 ml). Titanium isopropoxide (7.5 g) (manufactured by Kanto Chemical Co., Inc.) was added to and dissolved in the ethanol solution. Next, an ethanol solution (100 ml) containing water (3.5 g) (the pH was adjusted to 9.0 with aqueous ammonia) was added dropwise to the dispersion at a rate of 0.5 ml/min. After the addition, the dispersion was further stirred for one hour. Thereafter the mixture was subjected to filtration and rinsing to collect phosphor particles. The resulting phosphor particles were vacuum dried at 120° C. for one hour.

"Measurement of thickness of covering layer and elemental composition analysis in the cross-sectional direction" were performed on the covered phosphor particles by the same method as Example 1. The result showed that an about 57-nm-thick covering layer was formed on the surface.

According to the elemental composition curve provided by the elemental composition analysis in the cross-sectional direction, a peak of titanium derived from the covering layer was observed on the surface. Further, the curve of silicon was only a flat curve derived from a phosphor matrix.

Figure 21:
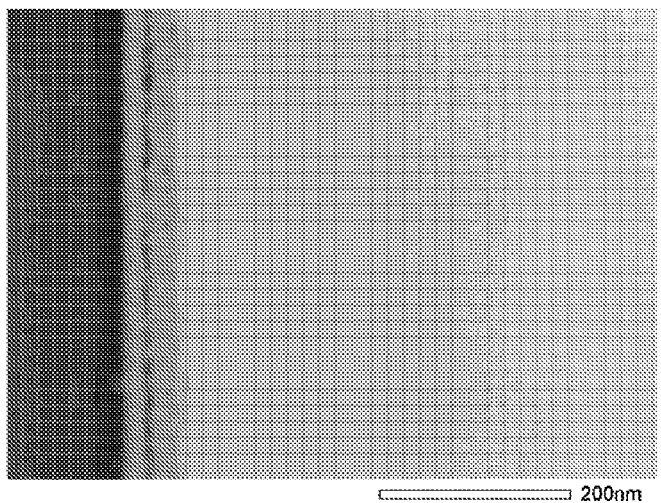
FIG. 21 is a photograph of a cross-section of a surface treated phosphor obtained in Comparative Example 6.
Figure 22:
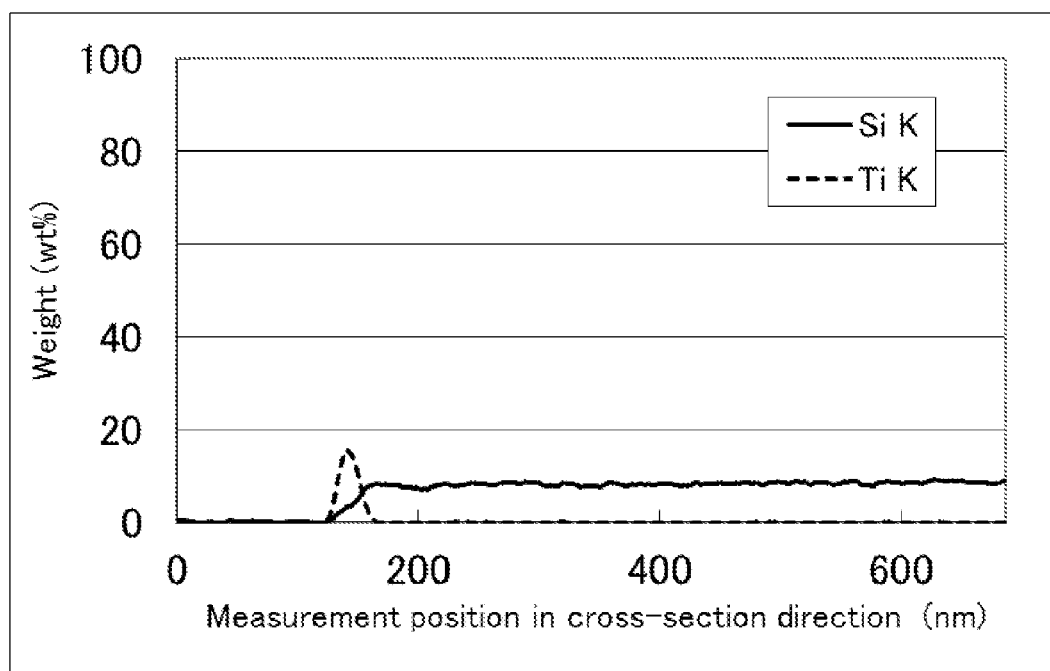
FIG. 22 shows element distribution data of the surface treated phosphor in the cross-sectional direction obtained in Comparative Example 6.

FIG. 21 shows an FE-TEM cross-section photograph of the resulting surface treated phosphor. FIG. 22 shows the results of the elemental analysis in the cross-sectional direction.

Comparative Example 7

A green silicate phosphor (5.0 g) including $(Sr,Ba)_2SiO_4$: $Eu^{2+}$ (emission wavelength: 529 nm) as a main component was dispersed in a dehydrated ethanol solution (300 ml). Next, dehydrated ethanol (100 ml) in which titanium isopropoxide (5.0 g) (manufactured by Kanto Chemical Co., Inc.) was dissolved and an ethanol solution (100 ml) in which water (5.0 g) (the pH was adjusted to 9.0 with aqueous ammonia) was dispersed were separately added dropwise at a rate of 0.5 ml/min. After the addition, the dispersion was further stirred for one hour. Thereafter the mixture was subjected to filtration and rinsing to collect phosphor particles. The resulting phosphor particles were vacuum dried at 50° C. for one hour.

The phosphor dried was dispersed in a mixture of ethanol (100 g) and aqueous ammonia (3.0 g) (10 wt %). A solution 1 to be added (a mixed solution of ethanol (12.5 g) and tetraethoxysilane (2.5 g)) and a solution 2 to be added (2.5 wt % aqueous ammonia (15 g)) were added dropwise at the same time using different dropping devices at a rate of 0.5 ml/min while the dispersion was maintained at 50° C. After the addition, the mixture was subjected to filtration and rinsing to collect phosphor particles. The resulting phosphor particles were vacuum dried at 120° C. for one hour.

"Measurement of thickness of covering layer and elemental composition analysis in the cross-sectional direction" were performed on the covered phosphor particles by the same method as Example 1. The result showed that an about 79-nm-thick covering layer was formed on the surface. According to the elemental composition curve provided by the elemental composition analysis in the cross-sectional direction, a peak of silicon was observed on the surface side and a peak of titanium was on an inner side as compared to the peak of silicon.

Figure 23:
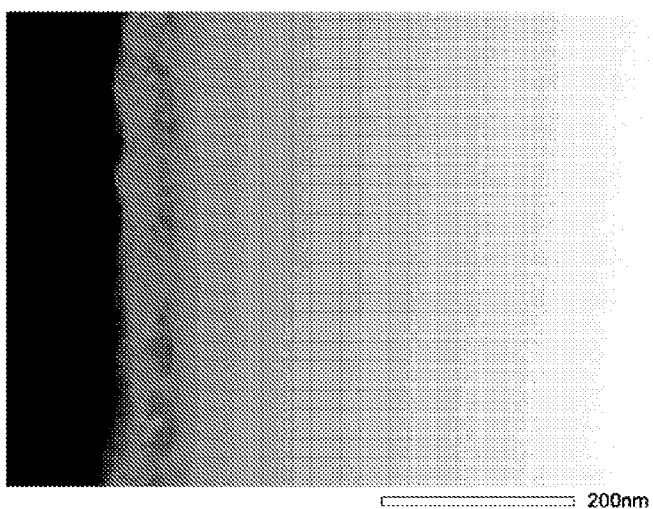
FIG. 23 is a photograph of a cross-section of a surface treated phosphor obtained in Comparative Example 7.
Figure 24:
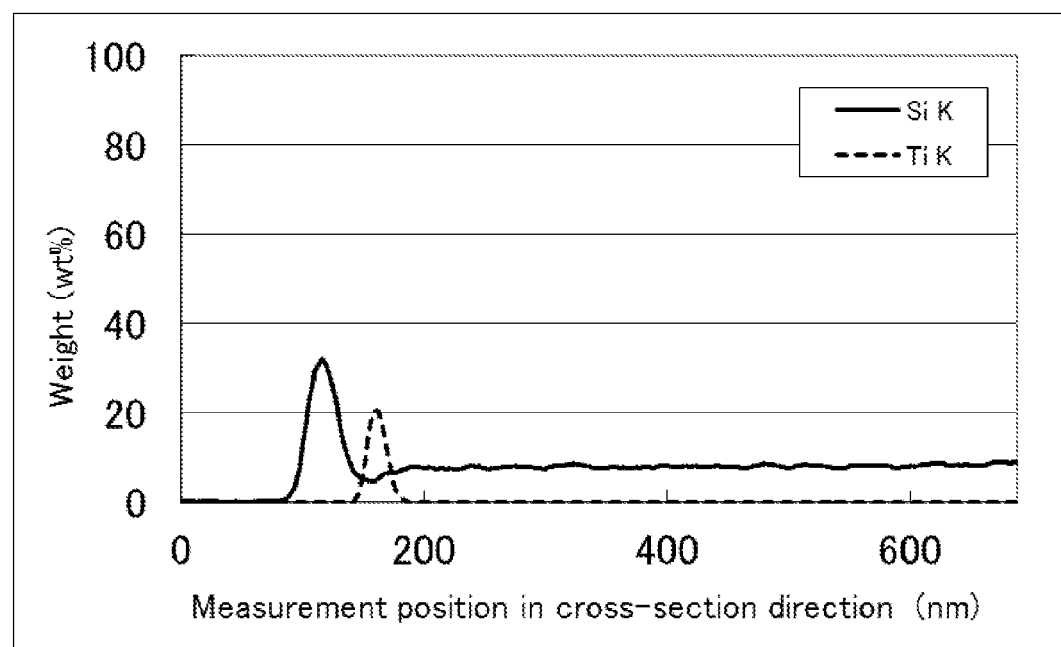
FIG. 24 shows element distribution data of the surface treated phosphor in the cross-sectional direction obtained in Comparative Example 7.
Figure 25:
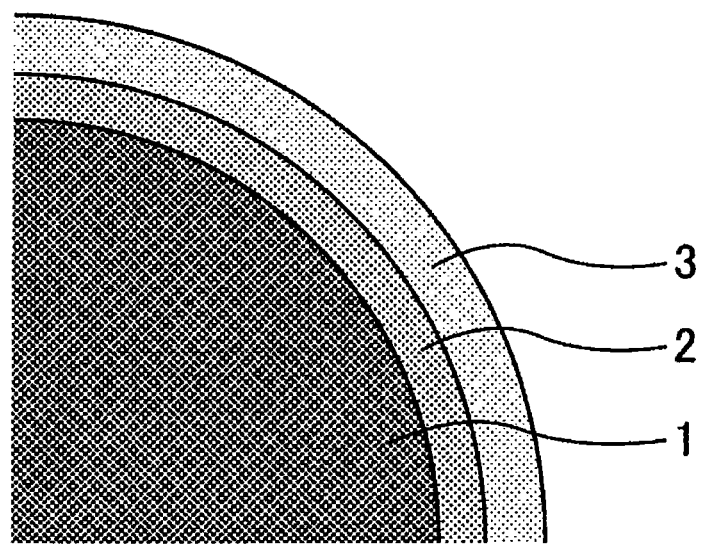
FIG. 25 is a schematic cross-sectional view showing one example of a surface treated phosphor of the present invention.

FIG. 23 shows an FE-TEM cross-section photograph of the resulting surface treated phosphor. FIG. 24 shows the results of the elemental analysis in the cross-sectional direction.

(Evaluation Method)
<Evaluation 1 of Moisture Resistance of Phosphor (PCT)>

An amount of 8 parts by weight of a surface treated phosphor or a phosphor obtained in each of Examples and Comparative Examples was mixed and dispersed in 100 parts by weight of a silicone resin (OE6630, manufacture by Dow Corning Corporation) and the mixture was degassed to prepare a phosphor-containing resin composition. Next, the phosphor-containing resin composition prepared was injected into an LED package (emission peak wavelength of 460 nm) that was mounted on a substrate to fill the package with the composition. The composition was heated at 150° C. for two hours to be cured. In such a process, an LED device was produced.

The resulting LED device was subjected to a moisture resistance test in a closed and pressure-resistant device under conditions at a temperature of 121° C. and relative humidity of 100% (pressure cooker test (PCT)).

The moisture resistance of the phosphor was evaluated from variation of brightness obtained by measuring the luminescence properties of an LED chip before and after the PCT. Specifically, relative moisture resistance was evaluated based on retention of brightness of a sample after 72 hours from the start of the PCT (PCT 72-h retention of brightness) relative to brightness of a sample before the PCT.

PCT 72-h retention of brightness(%)=(brightness after PCT for 72 hours/brightness before PCT)×100

An OL770 measurement system manufactured by Optronic Laboratories, Inc. was used as the measuring apparatus. Table 1 shows the results.
<Evaluation 2 of Moisture Resistance of Phosphor (Measurement of Electric Conductivity after Immersion in Water)>

An amount of 1 g of a surface treated phosphor or a phosphor obtained in each of Examples and Comparative Examples was added to pure water (300 g) (temperature 35° C.) while the water was stirred. The electric conductivity of the dispersion after 60 minutes from the start of the addition was measured using a conductivity meter (ES-51, manufactured by Horiba, Ltd.).
<Evaluation of Dispersibility of Phosphor>

The dispersibility of a phosphor in a resin was evaluated using a centrifugal sedimentation and transmittion type dispersion stability analyzer (LUMiSizer612, manufactured by LUM GmbH). Specifically, about a 1 ml phosphor-silicone resin composition in which 8% by weight of a surface treated phosphor or a phosphor obtained in each of Examples and Comparative Examples was dispersed in a silicone resin was put into a glass analysis cell. The supernatant liquid was subjected to light and an integrated value of variation of the transmitted light volume per hour was determined and the dispersibility was evaluated.

Table 1 shows ratios relative to the phosphor-resin composition including the phosphor of Comparative Example 1 in cases where the variation of the transmitted light volume of the phosphor-resin composition including the phosphor of Comparative Example 1 is 1.00.

TABLE 1

| | Phosphor matrix | | | Surface covering layer | | Evaluation | | |
| | | | | | | Water resistance | | |
| | | | | | Si content at the | PCT 72-h | Electric | |
| | | Emission | | | | maximum peak of | Retention of | conductivity after | |
| | | wavelength | $S_1X$ | Specific | $S_2X$ | specific element | brightness | immersion in | |
| | Color | (nm) | (% by weight) | element | (% by weight) | (% by weight) | (%) | water (mS/m) | Dispersibility |
|---|---|---|---|---|---|---|---|---|---|
| Example 1 | Green | 529 | 10 | Ti | 23 | 3 | 91.6 | 11.7 | 0.90 |
| Example 2 | Green | 529 | 10 | Ti | 32 | 5.1 | 96.7 | 7.9 | 0.91 |
| Example 3 | Green | 529 | 10 | Ti | 44 | 4.2 | 94.1 | 8.6 | 0.90 |

TABLE 1-continued

| | Phosphor matrix | | | Surface covering layer | | | Evaluation | | |
| | | | | | | | | Water resistance | |
| | Color | Emission wavelength (nm) | $S_1$* (% by weight) | Specific element | $S_2$* (% by weight) | Si content at the maximum peak of specific element (% by weight) | PCT 72-h Retention of brightness (%) | Electric conductivity after immersion in water (mS/m) | Dispersibility |
|---|---|---|---|---|---|---|---|---|---|
| Example 4 | Green | 529 | 10 | Zr | 40 | 3.5 | 92.5 | 10.9 | 0.90 |
| Example 5 | Green | 529 | 10 | V | 15 | 0.5 | 89.6 | 17.1 | 0.90 |
| Example 6 | Green | 529 | 10 | Mo | 19 | 1.2 | 92.3 | 10.5 | 0.90 |
| Example 7 | Green | 525 | 16 | Ti | 36 | 14 | 92.0 | 14.2 | 0.91 |
| Example 8 | Yellow | 550 | 8 | Ti | 30 | 9.5 | 93.8 | 8.5 | 0.91 |
| Example 9 | Yellow | 565 | 10 | Ti | 19.5 | 4.9 | 91.6 | 14.0 | 0.90 |
| Comparative Example 1 | Green | 529 | 10 | — | — | — | 71.8 | 256 | 1.00 |
| Comparative Example 2 | Green | 525 | 16 | — | — | — | 74.3 | 286 | 1.00 |
| Comparative Example 3 | Yellow | 550 | 8 | — | — | — | 76.9 | 210 | 1.00 |
| Comparative Example 4 | Yellow | 565 | 10 | — | — | — | 73.5 | 221 | 1.00 |
| Comparative Example 5 | Green | 529 | 10 | — | 31.0 | — | 76.7 | 201 | 0.95 |
| Comparative Example 6 | Green | 529 | 10 | Ti | — | 4.0 | 75.2 | 212 | 0.96 |
| Comparative Example 7 | Green | 529 | 10 | Ti | 32.0 | 6.0 | 79.3 | 189 | 0.95 |

*$S_1$: Si content (% by weight) of phosphor matrix $S_2$: Si content (% by weight) at the maximum peak value

TABLE 2

Alkaline earth metal contents[1]) of phosphor matrix, intermediate layer, and surface layer

| | Phosphor matrix ($C_1$) | Intermediate layer ($C_2$) | Surface layer ($C_3$) | Relation between $C_1$ and $C_2$ | Relation between $C_2$ and $C_3$ |
|---|---|---|---|---|---|
| Example 3 | 78 | 54 | 58 | $C_2 < C_1$ | $C_2 < C_3$ |
| Example 4 | 78 | 40 | 45 | $C_2 < C_1$ | $C_2 < C_3$ |
| Example 8 | 72 | 38 | 48 | $C_2 < C_1$ | $C_2 < C_3$ |

[1])$C_1$, $C_2$, and $C_3$ are alkaline earth metal contents (% by weight) of phosphor matrix, intermediate layer, and surface layer, respectively.

INDUSTRIAL APPLICABILITY

According to the present invention, a surface treated phosphor having high dispersibility and remarkably improved moisture resistance without degradation in fluorescence properties and a method of producing the surface treated phosphor can be provided.

The invention claimed is:

1. A surface treated phosphor comprising:
a phosphor matrix including an alkaline earth metal and silicon; and
a surface treatment layer including an alkaline earth metal, silicon, and a specific element belonging to groups 4 to 6 of the periodic table,
wherein, when element distribution of the surface treatment layer in the thickness direction viewed in cross-section is determined by electron microscopy and energy dispersive X-ray spectroscopy coupled with the electron microscopy, the position representing the maximum peak of the specific element content is located closer to an upper surface of the surface treatment layer than the position representing the maximum peak of a silicon content in the surface treatment layer and silicon contents of the phosphor matrix and the surface treatment layer satisfy the following formula (1):

[Formula 1]

$$S_1 < S_2 \qquad (1)$$

wherein $S_1$ represents the silicon content in the phosphor matrix and $S_2$ represents the silicon content in the surface treatment layer.

2. The surface treated phosphor according to claim 1, wherein, in the element distribution of the surface treatment layer in the thickness direction viewed in cross-section, silicon is detected at the position representing the maximum peak of the specific element.

3. The surface treated phosphor according to claim 1, wherein the surface treatment layer includes an intermediate layer and a surface layer formed in the noted order from inside toward the outermost surface, and an alkaline earth metal content of each layer satisfies the following formulae (2) and (3):

[Formula 2]

$$C_2 < C_1 \qquad (2)$$

$$C_2 < C_3 \qquad (3)$$

wherein $C_1$ represents the alkaline earth metal content of the phosphor matrix, $C_2$ represents the alkaline earth metal content of the intermediate layer, and $C_3$ represents the alkaline earth metal content of the surface layer.

4. The surface treated phosphor according to claim 3, wherein $C_2$ is ⅔ or less of $C_1$.

5. The surface treated phosphor according to claim 1, wherein an alkaline earth metal present in the surface treatment layer is an alkaline earth metal derived from the phosphor matrix.

6. The surface treated phosphor according to claim 1, wherein the phosphor matrix comprises a silicate phosphor that contains an alkaline earth metal.

7. The surface treated phosphor according to claim 6, wherein the phosphor matrix comprises a silicate phosphor represented by the following formula (4):

$$(Sr_{1-x}M_x)_y SiO_4:Eu^{2+} \quad (4)$$

wherein M is at least one metal selected from the group consisting of Ba, Ca, Mg, and Zn.

8. The surface treated phosphor according to claim 6, wherein the phosphor matrix comprises a silicate phosphor represented by the following formula (5):

$$(Sr_{1-x}M_x)_y SiO_4:Eu^{2+}D \quad (5)$$

wherein M is at least one metal selected from the group consisting of Ba, Ca, Mg, and Zn, and D is an anion of a halogen selected from the group consisting of F, Cl, and Br.

9. The surface treated phosphor according to claim 1, wherein an electric conductivity of water is 100 mS/m or lower when 1 part by weight of the surface treated phosphor is immersed in 300 parts by weight of pure water for 10 minutes.

10. A phosphor-containing resin composition comprising:
the surface treated phosphor according to claim 1: and
an epoxy resin and/or a silicone resin.

11. A wavelength converting composite comprising:
at least one resin selected from the group consisting of resins of polyvinyl acetate, polyvinyl butyral, polyethylene, polypropylene, polymethylmethacrylate, polycarbonate, and a cyclic olefin copolymer; and
the surface treated phosphor according to claim 1, dispersed in the at least one resin.

12. A wavelength converting sheet being a sheet of the wavelength converting composite according to claim 11.

13. A photoelectric converter comprising:
the wavelength converting composite according to claim 11 as a component.

14. A semiconductor light-emitting element comprising:
the surface treated phosphor according to claim 1.

15. An LED device comprising:
an LED chip;
a resin flame surrounding the LED chip; and
a layer of a phosphor filling a concave portion defined by the resin flame,
wherein the layer of a phosphor includes the surface treated phosphor according to claim 1 and an sealing resin.

16. The LED device according to claim 15, wherein the device keeps retention of brightness of 80% or higher after it is aged for 72 hours under conditions at a temperature of 121° C. and a relative humidity of 100%.

17. A backlight for liquid crystal display element comprising:
the LED device according to claim 15 as a component.

18. An image display device comprising:
the LED device according to claim 15 as a component.

19. A lighting equipment comprising:
the LED device according to claim 15 as a component.

20. A method of producing the surface treated phosphor according to claim 1, comprising:
forming a surface treatment layer by dispersing a phosphor matrix in a solution that includes a complex ion containing a specific element and fluorine to bring the phosphor matrix into contact with the solution.

21. The method according to claim 20, wherein the complex ion containing a specific element and fluorine is $AF_6^{2-}$,
wherein A is at least one specific element selected from the group consisting of elements belonging to groups 4 to 6 of the periodic table.

22. The method according to claim 20, wherein a boric acid is further added during the formation of the surface treatment layer.

* * * * *